US011243388B2

(12) United States Patent
Yabugaki

(10) Patent No.: US 11,243,388 B2
(45) Date of Patent: Feb. 8, 2022

(54) SAMPLING CIRCUIT AND LASER SCANNING MICROSCOPE

(71) Applicant: OLYMPUS CORPORATION, Hachioji (JP)

(72) Inventor: Hiroyuki Yabugaki, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 133 days.

(21) Appl. No.: 16/833,714

(22) Filed: Mar. 30, 2020

(65) Prior Publication Data

US 2020/0319444 A1  Oct. 8, 2020

(30) Foreign Application Priority Data

Apr. 8, 2019  (JP) .............................. JP2019-073240
Mar. 4, 2020  (JP) .............................. JP2020-036710

(51) Int. Cl.
G02B 21/00 (2006.01)
H03L 7/08 (2006.01)

(52) U.S. Cl.
CPC ....... *G02B 21/008* (2013.01); *G02B 21/0032* (2013.01); *H03L 7/08* (2013.01)

(58) Field of Classification Search
CPC ...... G02B 21/008; G02B 21/0032; H03L 7/08
See application file for complete search history.

(56) References Cited

U.S. PATENT DOCUMENTS

2003/0063367 A1* 4/2003 Widzgowski ...... G02B 21/0048
359/287

FOREIGN PATENT DOCUMENTS

JP  2011123142 A  6/2011

* cited by examiner

*Primary Examiner* — Que Tan Le
*Assistant Examiner* — Don J Williams
(74) *Attorney, Agent, or Firm* — Holtz, Holtz & Volek PC

(57) ABSTRACT

A sampling circuit includes: a phase synchronization circuit for generating, by a phase-locked loop, an N-multiplied clock that is N times as high as the scanning frequency of a scanning position signal of a resonant scanner and is synchronized with the phase of the scanning position signal, an AD converter for AD-converting a detection signal obtained by detecting light from a sample in synchronization with the N-multiplied clock, a counter for counting the number of clocks in synchronization with the N-multiplied clock, a memory for storing a counter threshold corresponding to a desired scanning position of the resonant scanner, a comparison circuit for outputting a sampling clock in response to the counter threshold and a counter value of the counter circuit coinciding with each other, and a data processing circuit for sampling the AD-converted detection signal based on the sampling clock and generating pixel data.

9 Claims, 23 Drawing Sheets

FIG. 3

COUNTER THRESHOLD STORAGE MEMORY

| No. | SCANNER SCANNING COORDINATE | COUNTER THRESHOLD |
|---|---|---|
| 0 | 0.00 | 100 |
| 1 | 1.23 | 112 |
| 2 | 2.46 | 136 |
| 3 | 3.69 | 172 |
| 509 | 154.98 | 1215 |
| 510 | 156.21 | 1230 |
| 511 | 157.44 | 1245 |
| 512 | 157.44 | 1460 |
| 1023 | 0.00 | 4136 |

FIG. 7

THEORETICAL VALUE

| No. | SCANNER SCANNING COORDINATE | COUNTER THRESHOLD | CORRECTION VALUE | CORRECTED COUNTER THRESHOLD | |
|---|---|---|---|---|---|
| 0 | 0.00 | 100 | 0 | 100 | ⎫ |
| 1 | 1.23 | 108 | 0 | 108 | ⎪ OUTWARD PATH |
| 2 | 2.46 | 119 | 0 | 119 | ⎪ |
| 3 | 3.69 | 132 | 0 | 132 | ⎭ |
| 509 | 154.98 | 1215 | 0 | 1215 | ⎫ |
| 510 | 156.21 | 1230 | 0 | 1230 | ⎪ |
| 511 | 157.44 | 1245 | 0 | 1245 | ⎪ |
| 512 | 157.44 | 1460 | 100 | 1560 | ⎬ RETURN PATH |
| 513 | 156.21 | 1475 | 100 | 1575 | ⎪ |
| 514 | 153.75 | 1490 | 100 | 1590 | ⎪ |
| 1023 | 0.00 | 4136 | 100 | 4236 | ⎭ |

FIG. 10

| No. | SCANNER SCANNING COORDINATE | COUNTER THRESHOLD | |
|---|---|---|---|
| 0 | 50.00 | 600 | |
| 1 | 51.23 | 615 | |
| 2 | 53.69 | 630 | |
| 3 | 57.38 | 645 | OUTWARD PATH |
| 57 | 117.54 | 815 | |
| 58 | 118.77 | 830 | |
| 59 | 120.00 | 845 | |
| 60 | 120.00 | 2691 | |
| 61 | 118.77 | 2706 | |
| 62 | 117.54 | 2721 | RETURN PATH |
| 119 | 50.00 | 3536 | |

FIG. 17

| No. | SCANNER SCANNING COORDINATE | AD DATA |
|---|---|---|
| 0 | 0.00 | 42 |
| 1 | 1.23 | 55 |
| 2 | 2.46 | 69 |
| 3 | 3.69 | 85 |
| 509 | 154.98 | 4058 |
| 510 | 156.21 | 4072 |
| 511 | 157.44 | 4085 |
| 512 | 157.44 | 4085 |
| 1023 | 0.00 | 42 |

SAMPLING CIRCUIT AND LASER SCANNING MICROSCOPE

CROSS-REFERENCE TO RELATED APPLICATIONS

This application is based on Japanese Patent Applications Nos. 2019-073240 and 2020-036710, the contents of which are incorporated herein by reference.

TECHNICAL FIELD

The present invention relates to a sampling circuit and a laser scanning microscope.

BACKGROUND ART

A technique for adjusting sampling timing of a detection signal from a sample according to a scanning position of a resonant scanner has been conventionally known (for example, see PTL 1). In the scanning microscope described in PTL 1, when a sampling clock is generated based on a scanning position signal of a resonant scanner, analog offset, noise removal on a circuit, temperature correction based on feedback of a temperature sensor, etc. are performed in a sampling clock generation circuit, thereby eliminating an influence of temperature change and variation in performance among individual scanners.

CITATION LIST

Patent Literature

Japanese Unexamined patent Application, Publication No. 2011-123142

SUMMARY OF INVENTION

An aspect of the present invention is a sampling circuit comprising: a phase synchronization circuit that generates, based on a scanning position signal indicating a scanning position of a laser light scanned on a sample by a scanner and by a phase-locked loop, an N-multiplied clock which has a frequency N times as high as a scan frequency of the scanning position signal (N represents an integer of 1 or more) and is synchronized with a phase of the scanning position signal; an AD converter that AD-converts a detection signal obtained by converting light from the sample by a detector in synchronization with the N-multiplied clock generated by the phase synchronization circuit; a counter that counts the number of clocks in synchronization with the N-multiplied clock; a memory that stores at least one predetermined counter threshold of the counter corresponding to a desired scanning position by the scanner; a comparison circuit that compares the counter threshold stored in the memory with a counter value indicating the number of clocks counted by the counter and outputs a sampling clock in response to the counter threshold and the counter value coinciding with each other; and a data processing circuit that samples the detection signal AD-converted by the AD converter based on the sampling clock output from the comparison circuit and generates pixel data based on the sampled detection signal.

Another aspect of the present invention is a laser scanning microscope comprising: the above-described sampling circuit; a laser light source that generates the laser light; a microscope main body including the scanner and the detector; and a controller that controls the sampling circuit and the scanner, wherein the controller is configured to generate image data of the sample based on the pixel data obtained by the sampling circuit.

BRIEF DESCRIPTION OF DRAWINGS

FIG. 3 is a diagram showing an example of a counter threshold stored in a counter threshold storage memory.

FIG. 7 is a diagram showing an example of correction values of counter thresholds and corrected counter thresholds.

FIG. 10 is a diagram showing an example of a counter threshold stored in a counter threshold storage memory.

FIG. 17 is a diagram showing an example of correction values of counter thresholds and corrected counter thresholds.

DESCRIPTION OF EMBODIMENTS

First Embodiment

A sampling circuit and a laser scanning microscope according to a first embodiment of the present invention will be described below with reference to the drawings.

Figure 1:
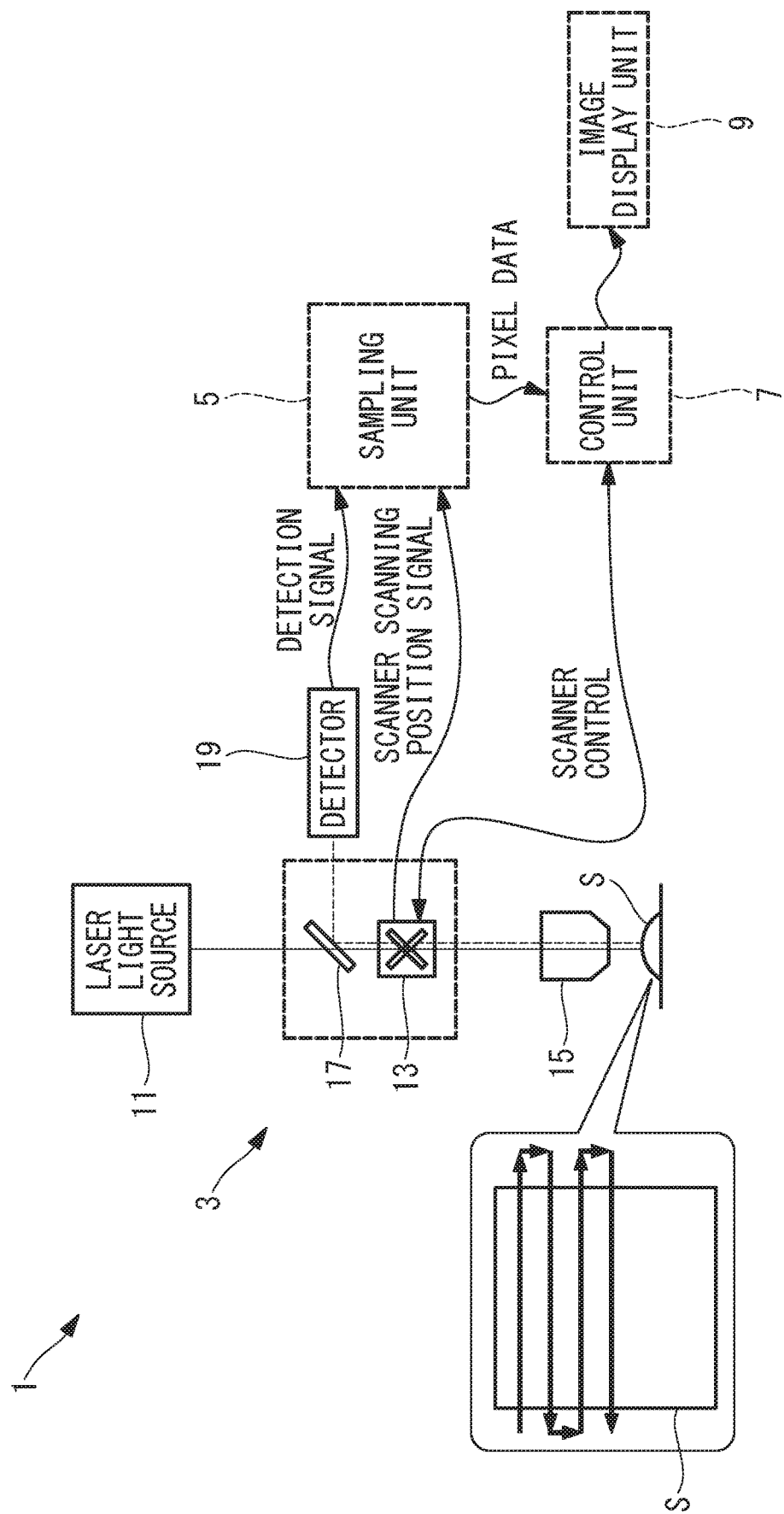
FIG. 1 is a schematic configuration diagram of a laser scanning microscope according to a first embodiment of the present invention.

The laser scanning microscope 1 according to the present embodiment includes, for example, as shown in FIG. 1, a microscope main body 3 for observing a sample S, a sampling unit (sampling circuit) 5 for generating pixel data of the sample S, a control unit 7 for controlling the microscope main body 3 and the sampling unit 5, and an image display unit 9 for displaying an image of the sample S.

The microscope main body 3 includes a laser light source 11 for generating a laser light, a resonant scanner (scanner) 13 for two-dimensionally scanning the laser light emitted from the laser light source 11, an objective lens 15 for focusing a laser light scanned by the resonant scanner 13 onto the sample S while focusing fluorescence emitted from the sample S, an excitation dichroic mirror 17 for causing the laser light scanned by the resonant scanner 13 to pass therethrough and enter the objective lens 15 while reflecting fluorescence returning in an optical path of a laser light through the objective lens 15 and the resonant scanner 13 to cause the fluorescence to diverge from the optical path of the laser light, and a detector 19 such as a photomultiplier tube for detecting the fluorescence which has been caused to diverge by the excitation dichroic mirror 17.

It should be noted that the resonant scanner 13 for two-dimensionally scanning the laser light may be constituted by a resonant scanner for scanning at high speed in one direction and a galvanomirror scanner for scanning at low speed in a direction perpendicular to the scanning direction of the resonant scanner.

The resonant scanner 13 transmits, to the sampling unit 5, a scanner scanning position signal indicating the scanning position of a laser light which corresponds to a swing angle of a mirror (not shown) constituting the resonant scanner 13.

The detector 19 transmits a detection signal corresponding to the intensity of the detected fluorescence to the sampling unit 5.

Figure 2:
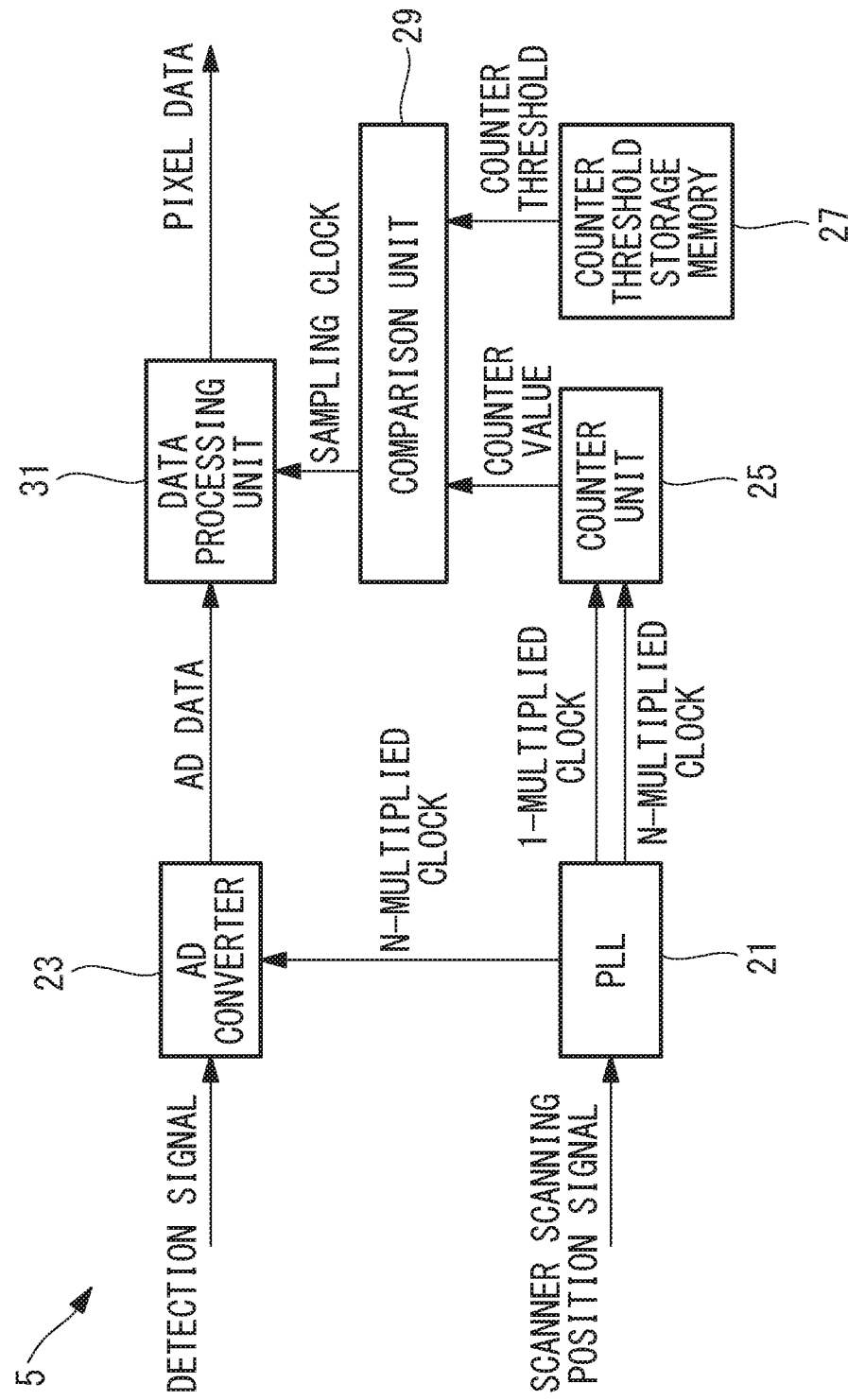
FIG. 2 is a block diagram showing a configuration of a sampling unit in FIG. 1.

For example, as shown in FIG. 2, the sampling unit 5 includes a PLL unit (phase synchronization unit) 21 for generating an N-multiplied clock and a 1-multiplied clock synchronized with the oscillation of the resonant scanner 13 by a phase-locked loop, an AD converter (AD conversion unit) 23 for performing AD-conversion on the detection signal transmitted from the detector 19, a counter unit 25 for counting the number of clocks in synchronization with the N-multiplied clock, a counter threshold storage memory (threshold storage unit) 27 for storing at least one predetermined counter threshold of the counter unit 25 which corresponds to a desired scanning position by the resonant scanner 13, a comparison unit 29 for comparing the counter threshold stored by the counter threshold storage memory 27 with a counter value indicating the number of clocks counted by the counter unit 25, and a data processing unit (image data generation unit) 31 for generating image data based on the detection signal after the AD conversion by the AD converter 23.

Based on the scanner scanning position signal sent from the resonant scanner 13, the PLL unit 21 generates a N-multiplied clock which has a frequency N times (N represents an integer of 1 or more) of the scanning frequency of the scanner scanning position signal and also is synchronized with the phase of the scanner scanning position signal. In addition, based on the scanner scanning position signal sent from the resonant scanner 13, the PLL unit 21 generates a 1-multiplied clock which has a frequency equal to the scanning frequency of the scanner scanning position signal and is synchronized with the phase of the scanner scanning position signal. Further, the PLL unit 21 transmits the generated N-multiplied clock to the AD converter 23 and the counter unit 25, and transmits the generated 1-multiplied clock to the counter unit 25.

The AD converter 23 converts the detection signal sent from the detector 19 into AD data in synchronization with the rising of the N-multiplied clock sent from the PLL unit 21, and transmits the AD data to the data processing unit 31.

The counter unit 25 repeats an operation of counting up the number of clocks in synchronization with the rising of the N-multiplied clock sent from the PLL unit 21, and resetting the counted number of clocks, that is, the counter value in synchronization with the rising of the 1-multiplied clock sent from the PLL unit 21. Furthermore, the counter unit 25 transmits the counter value to the comparison unit 29 while counting up.

For example, a predetermined counter threshold of the counter unit 25 which is preset for each scanning coordinate of the resonant scanner 13 is stored in the counter threshold storage memory 27 in association with a number (No.) appended to each scanning coordinate as shown in FIG. 3.

The number of counter thresholds stored in the counter threshold storage memory 27 corresponds to the number of pixels of an image of the sample S, that is, a scanned image. By changing the number of counter thresholds, a scanned image can be generated with an arbitrary number of pixels. In FIG. 3, the number of pixels of the scan image of the resonant scanner 13 is set to 512 pixels. Nos. 0 to 511 indicate counter thresholds corresponding to respective pixels on an outward path of the resonant scanner 13, and Nos. 512 to 1023 indicate counter thresholds corresponding to respective pixels on a return path of the resonant scanner 13. The counter threshold storage memory 27 transmits the stored counter thresholds to the comparison unit 29.

Figure 4:
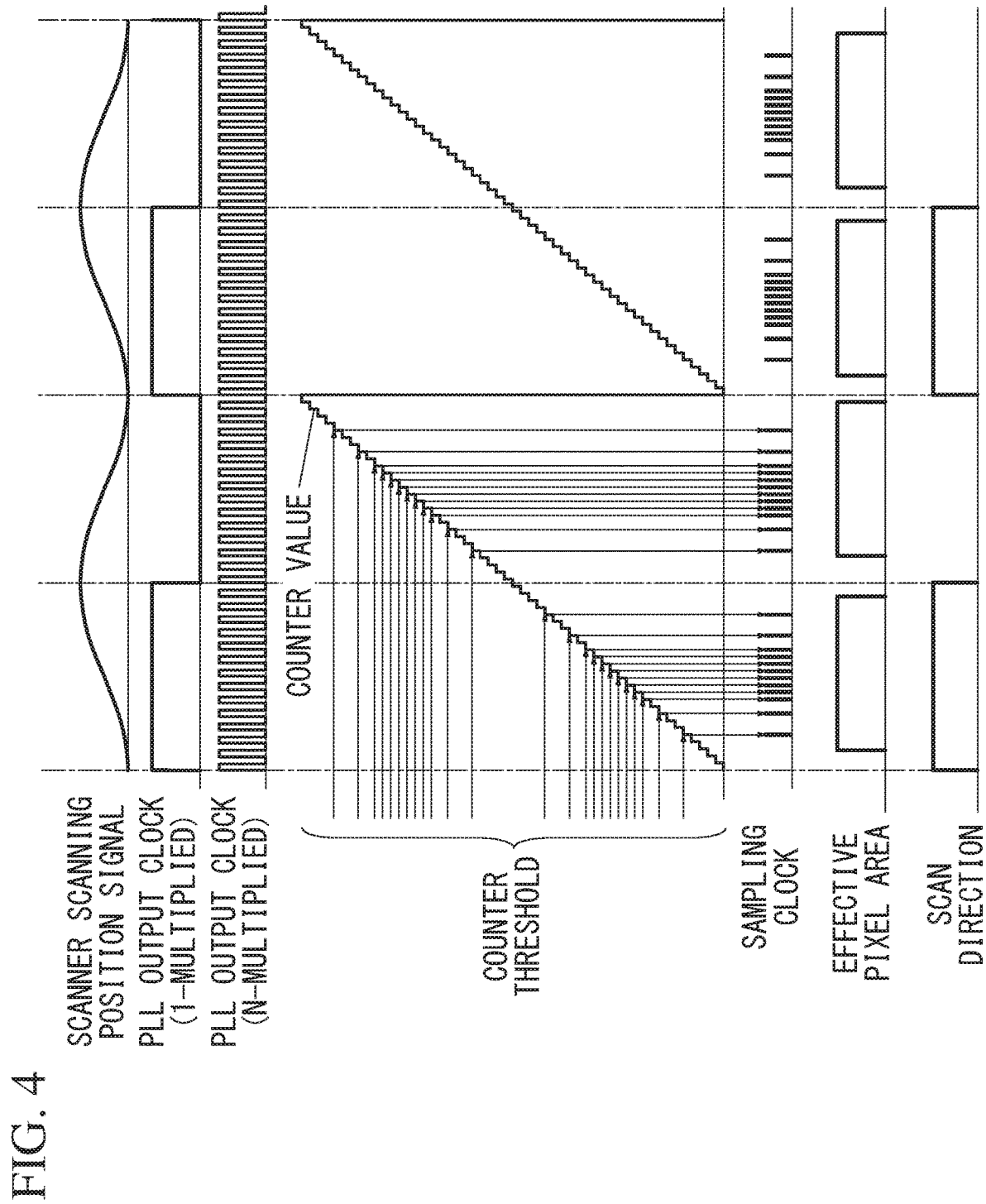
FIG. 4 is a timing chart showing an output timing of a sampling clock according to the first embodiment.

The comparison unit 29 outputs a sampling clock, for example, when the counter value sent from the counter unit 25 coincides with the counter threshold sent from the counter threshold storage memory 27 as shown in FIG. 4.

The data processing unit 31 samples the AD data from the AD converter 23 in synchronization with the rising of the sampling clock output from the comparison unit 29, and processes the sampled AD data. Further, the data processing unit 31 processes the AD data to generate brightness data for one pixel, and transmits the generated brightness data for one pixel as pixel data to the control unit 7.

The control unit 7 includes, for example, a storage unit such as a hard disk drive, a CPU (Central Processing Unit), a RAM (Random Access Memory), and a calculation unit for performing arithmetic processing (all not shown). The control unit 7 implements the following functions by executing a control program stored in the storage unit by the CPU.

For example, the control unit 7 controls the resonant scanner 13, and operates each part of the sampling unit 5. Further, the control unit 7 generates image data of the sample S based on pixel data sent from the data processing unit 31 of the sampling unit 5. The image data generated by the control unit 7 is displayed by the image display unit 9.

Next, the operation of the laser scanning microscope 1 according to the present embodiment will be described.

When the sample S is observed by the laser scanning microscope 1 having the aforementioned configuration, the resonant scanner 13 is driven by the control unit 7 to generate a laser light from the laser light source 11. The laser light emitted from the laser light source 11 is scanned by the resonant scanner 13 and then focused on the sample S by the objective lens 15. As a result, the laser light is two-dimensionally scanned on the sample S according to a swing operation of the resonant scanner 13. A scanner scanning position signal from the resonant scanner 13 is sent to the PLL unit 21 of the sampling unit 5.

Fluorescence which is emitted from the sample S due to irradiation of a laser light is collected by the objective lens 15, and then returns to the optical path of the laser light via the resonant scanner 13. Then, the fluorescence is reflected by the excitation dichroic mirror 17, whereby the fluorescence is incident to the detector 19. In the detector 19, the detected fluorescence is converted into a detection signal, and the detection signal is sent to the AD converter 23 of the sampling unit 5.

In the sampling unit 5, for example, as shown in FIG. 4, an N-multiplied clock and a 1-multiplied clock which are synchronized with the oscillation of the resonant scanner 13 are generated based on the scanner scanning position signal sent from the resonant scanner 13 by the PLL unit 21. Furthermore, the PLL unit 21 sends the generated N-multiplied clock to the AD converter 23 and the counter unit 25, and also sends the generated 1-multiplied clock to the counter unit 25.

Next, the AD converter 23 converts the detection signal sent from the detector 19 into AD data in synchronization with the rising of the N-multiplied clock, and sends the AD data to the data processing unit 31.

The counter value is counted up in synchronization with the rising of the N-multiplied clock by the counter unit 25, and the counter value is sent to the comparison unit 29 every time the counter value is counted up. The counter unit 25 repeats counting up the counter value every time the N-multiplied clock rises, and when the 1-multiplied clock rises, the counter value at that time is reset.

Next, the comparison unit 29 compares the counter value sent from the counter unit 25 with the counter threshold sent from the counter threshold storage memory 27. As shown in FIG. 4, a sampling clock which rises when the counter value and the counter threshold coincide with each other is sent from the comparison unit 29 to the data processing unit 31.

Next, the data processing unit 31 samples the AD data from the AD converter 23 in synchronization with the rising of the sampling clock sent from the comparison unit 29, and processes the sampled AD data. As a result, the brightness data for one pixel is generated by the data processing unit 31, and the generated brightness data is sent as pixel data to the control unit 7. The control unit 7 generates an image of the sample S based on the pixel data sent from the data processing unit 31.

As described above, according to the sampling unit 5 of the present embodiment, the detection signal from the sample S is converted to the AD data in synchronization with the N-multiplied clock which is synchronized with the phase of the scanner scanning position signal of the resonant scanner 13 generated by the PLL unit 21, and the number of clocks is counted by the counter unit 25. Then, the AD data is sampled in synchronization with a sampling clock output when the counter value of the counter unit 25 coincides with a counter threshold corresponding to a desired scanning position of the resonant scanner 13. As a result, pixel data can be generated based on AD data obtained at a timing when the desired scanning position is scanned by the resonant scanner 13.

In this case, since the AD conversion by the AD converter 23 and the counting by the counter unit 25 are synchronized with the N-multiplied clock synchronized with the scanner scanning position signal of the resonant scanner 13, the AD converter 23 and the counter unit 25 can be operated accurately in synchronization with the scanning of the resonant scanner 13 even when the oscillation period of the resonant scanner 13 fluctuates due to an influence of temperature change or the like or characteristics vary among resonant scanners 13.

Therefore, the sampling unit 5 can perform sampling in synchronization with the scanning of the resonant scanner 13 without requiring a complicated operation regardless of the influence of temperature change and the influence of variation in the characteristics among resonant scanners 13. Further, according to the laser scanning microscope 1 of the present embodiment, the image of the sample S can be generated with high accuracy based on the pixel data generated by the sampling unit 5.

Second Embodiment

Next, a sampling circuit and a laser scanning microscope according to a second embodiment of the present invention will be described.

Figure 5:
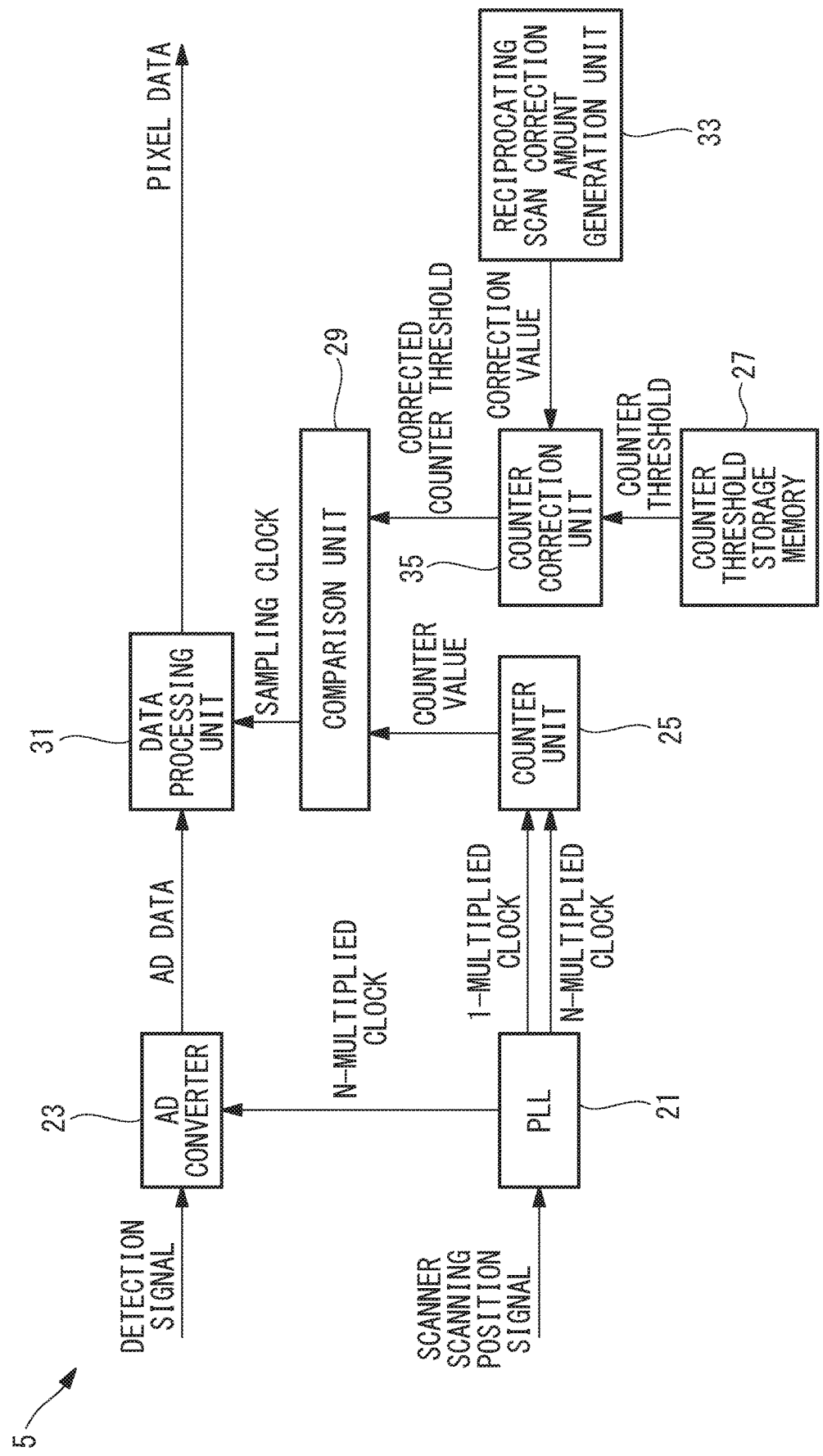
FIG. 5 is a block diagram showing a configuration of a sampling unit according to a second embodiment of the present invention.

The laser scanning microscope 1 according to the present embodiment is different from the first embodiment in that, for example, as shown in FIG. 5, the sampling unit 5 includes a reciprocating scan correction amount generation unit 33 (correction amount generation unit) 33 for outputting a correction value (correction amount) for correcting a deviation of a scanning start position of a laser light on an outward path and a return path by the resonant scanner 13, and a counter correction unit (counter threshold correction unit) 35 for correcting a counter threshold stored by the counter threshold storage memory 27 based on the correction value output from the reciprocating scan correction amount generation unit 33.

Hereafter, portions which are common in configuration to those of the sampling unit 5 according to the first embodiment are represented by the same reference signs, and description thereof is omitted.

Figure 6:
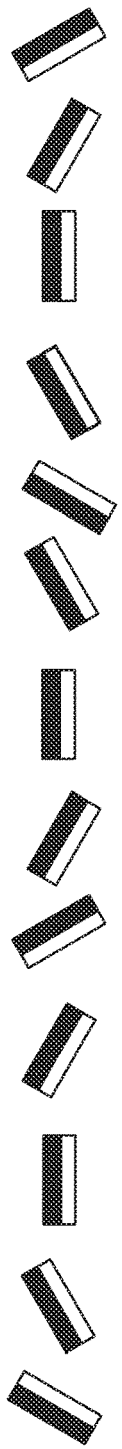
FIG. 6 is a diagram showing the relationship between a mirror position of a resonant scanner and a scanner scanning position signal.
Figure 6:
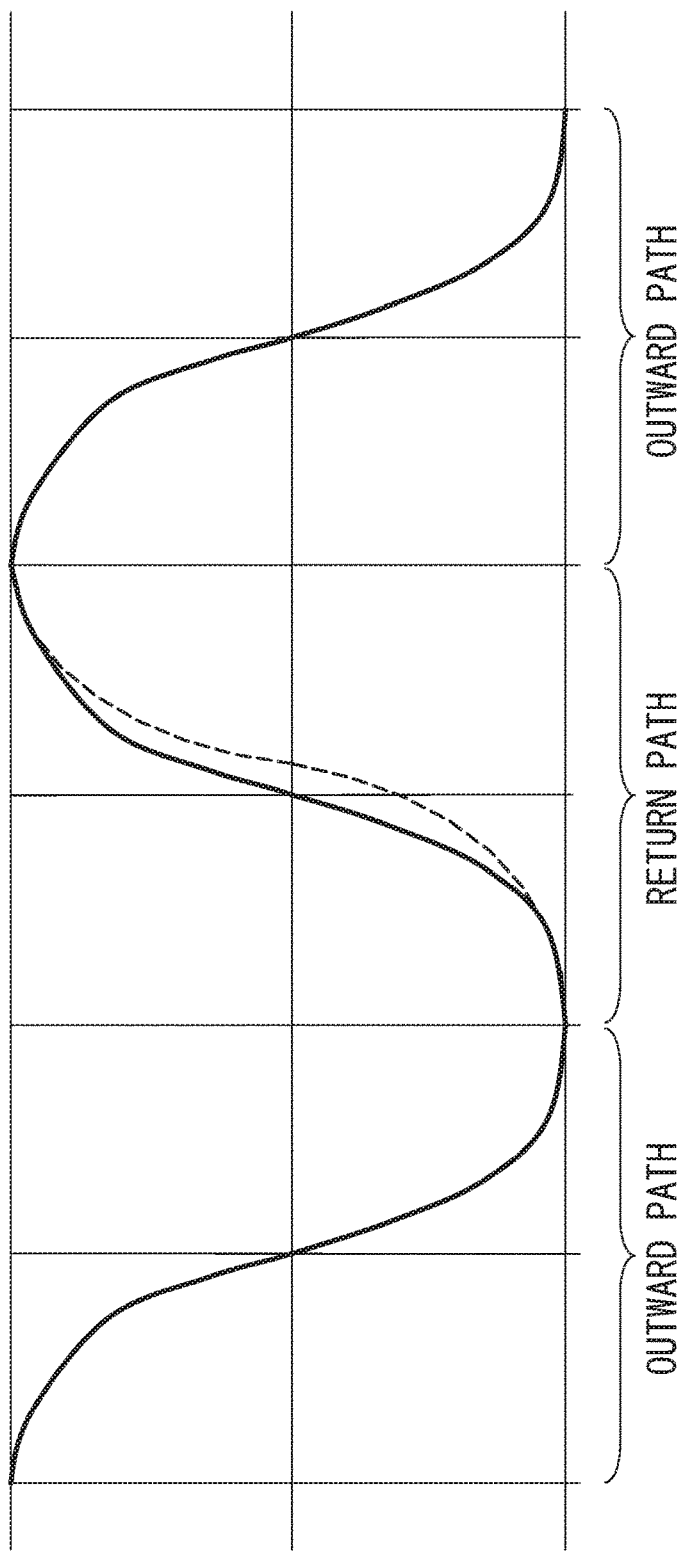

The scanning speed of the resonant scanner 13 is not constant between the outward path and the return path, and for example, as shown in FIG. 6, the scanning position of the resonant scanner 13 may be shifted between the outward path and the return path due to individual difference of the resonant scanner 13. An example shown in FIG. 6 shows a case where the scanning position on the return path is shifted with respect to the scanning position on the outward path. In FIG. 6, a scanner scanning position signal indicated by a solid line represents an ideal waveform, and a scanner scanning position signal indicated by a broken line represents a waveform when a shift occurs.

For example, as shown in FIG. 7, a theoretical value calculated from an ideal behavior of the resonant scanner 13 is stored as a counter threshold in the counter threshold storage memory 27 in association with a number (No.) assigned to each scanning coordinate by the resonant scanner 13. In the present embodiment, the counter threshold storage memory 27 transmits the stored counter thresholds to the counter correction unit 35.

For example, as shown in FIG. 7, in the reciprocating scan correction amount generation unit 33, a correction value which is preset for each scanning coordinate by the resonant scanner 13 is stored in association with a number (No.) assigned to each scanning coordinate by the resonant scanner 13. Further, the reciprocating scan correction amount generation unit 33 transmits the stored correction values to the counter correction unit 35. The user may adjust the correction value to an appropriate value while watching the scanned image of the sample S. FIG. 7 shows an example in which the counter thresholds of the return path are corrected, and 0 is set as a correction value of the outward path, and 100 is set as a correction value of the return path.

The counter correction unit 35 adds, to a counter threshold sent from the counter threshold storage memory 27, a correction value associated with a number (NO.) of the counter threshold out of the correction values sent from the reciprocating scan correction amount generation unit 33, thereby correcting the counter threshold. The counter correction unit 35 transmits the corrected counter threshold to the comparison unit 29.

Figure 8:
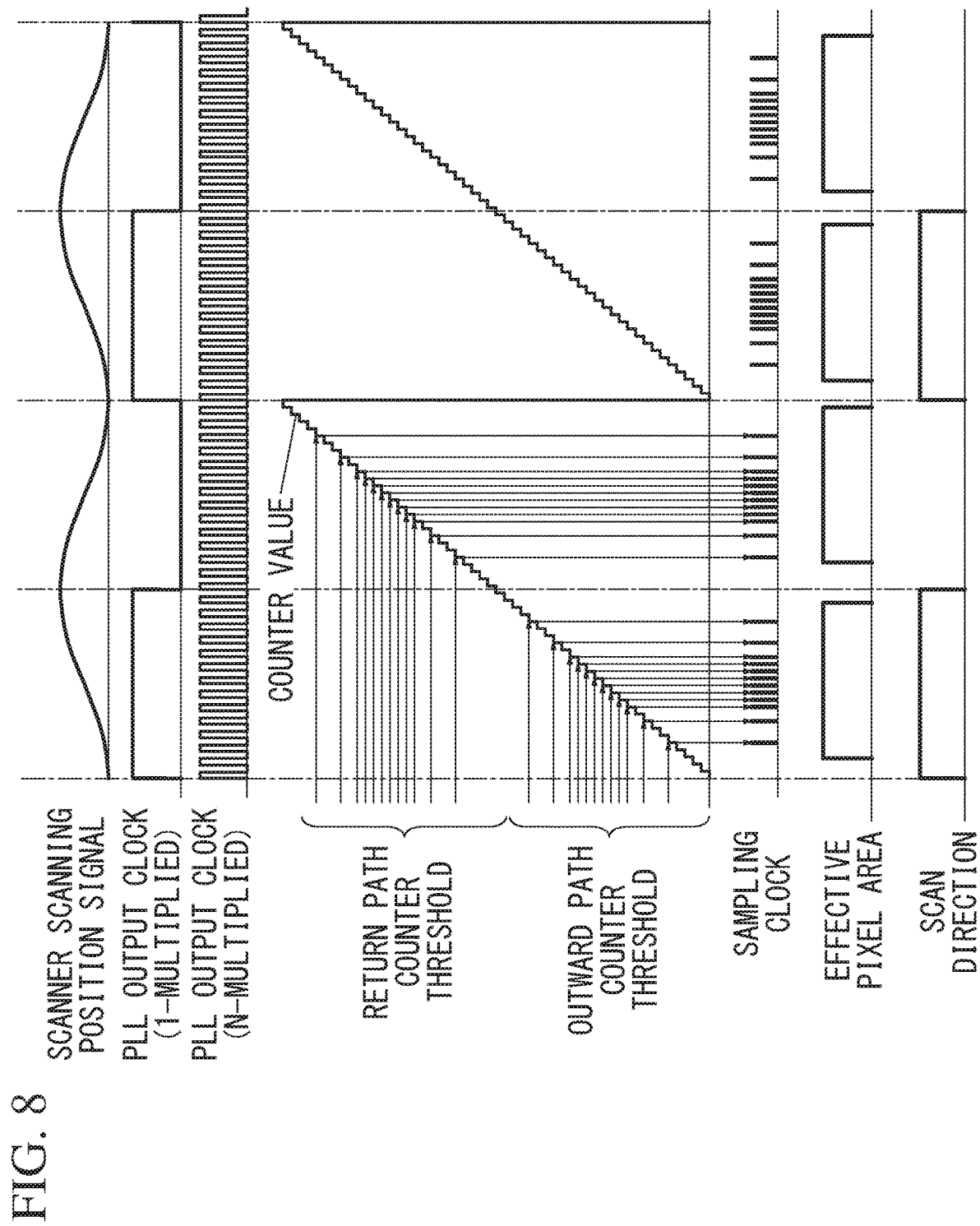
FIG. 8 is a timing chart showing an output timing of a sampling clock according to the second embodiment.

For example, as shown in FIG. 8, the comparison unit 29 outputs a sampling clock when the counter value sent from the counter unit 25 coincides with the corrected counter threshold sent from the counter correction unit 35.

According to the laser scanning microscope 1 of the present embodiment, the counter correction unit 35 corrects the counter threshold of the outward path and the counter threshold of the return path based on the correction values output from the reciprocating scan correction amount generation unit 33, and the comparison unit 29 generates the sampling clock based on the corrected counter thresholds, whereby the pixel shift between the outward path and the return path caused by the reciprocating scan can be corrected.

Third Embodiment

Next, a sampling circuit and a laser scanning microscope according to a third embodiment of the present invention will be described.

Figure 9:
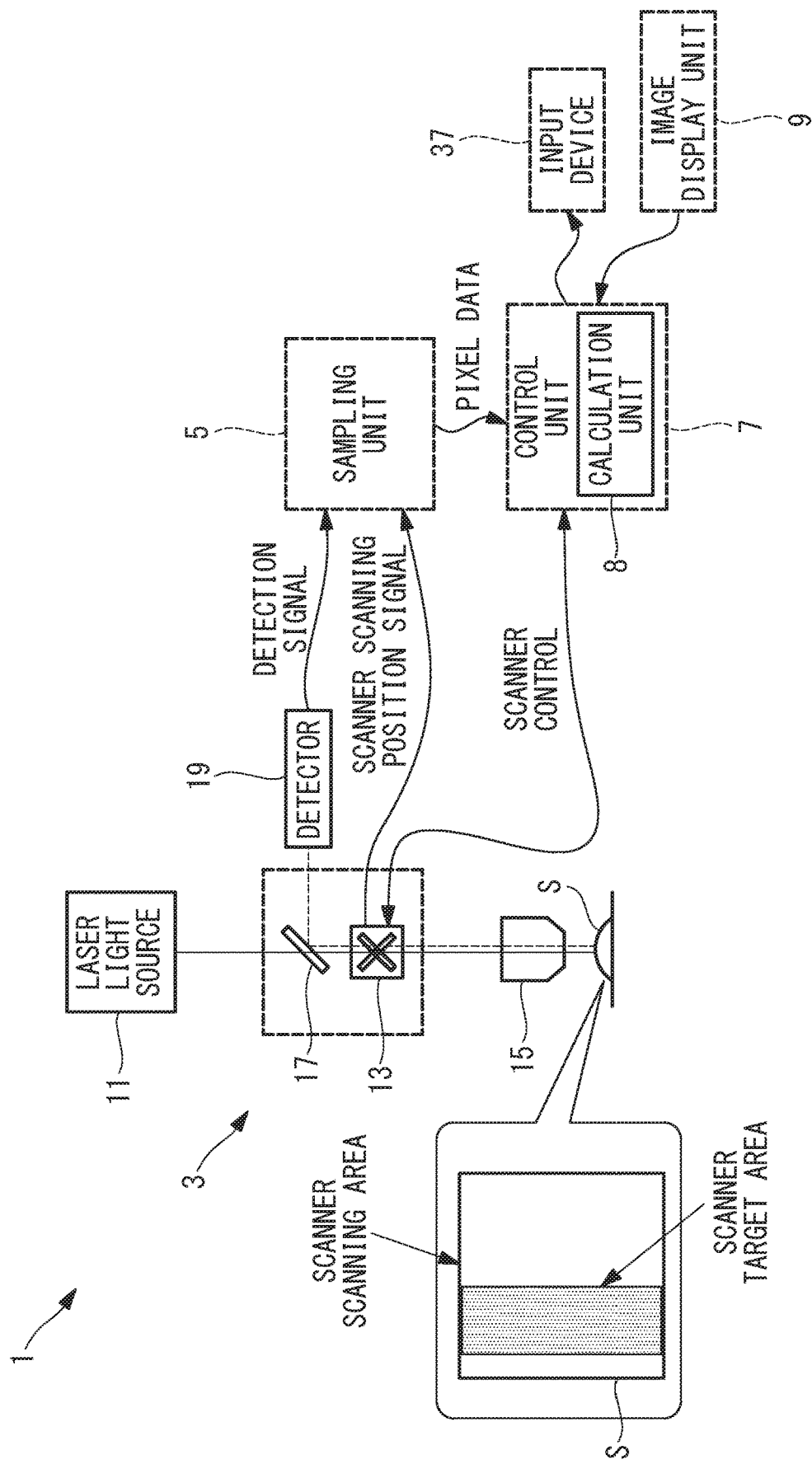
FIG. 9 is a schematic configuration diagram of a laser scanning microscope according to a third embodiment of the present invention.

For example, as shown in FIG. 9, the laser scanning microscope 1 according to the present embodiment is different from the first and second embodiments in that it includes an input device (input unit) 37 through which a user specifies a scan target area (scanning range) to be actually scanned with a laser light on the sample S by the resonant scanner 13, and the control unit 7 includes a calculation unit (threshold calculation unit) 8 for calculating counter thresholds based on the scan target area specified by the input device 37.

Hereafter, portions which are common in configuration to those of the laser scanning microscopes 1 according to the first and second embodiments are represented by the same reference signs, and description thereof is omitted.

The calculation unit 8 of the control unit 7 calculates a counter threshold and a scanning coordinate by the resonant scanner 13 for each pixel of the scan target area on the sample S specified by the user via the input device 37, and updates the counter thresholds in the counter threshold storage memory 27. For example, in an example shown in FIG. 10, scanning coordinates 50.00 to 120.00 of the specified scan target area and counter thresholds corresponding to the respective scanning coordinates are calculated, and the counter thresholds stored in the counter threshold storage memory 27 are updated.

Figure 11:
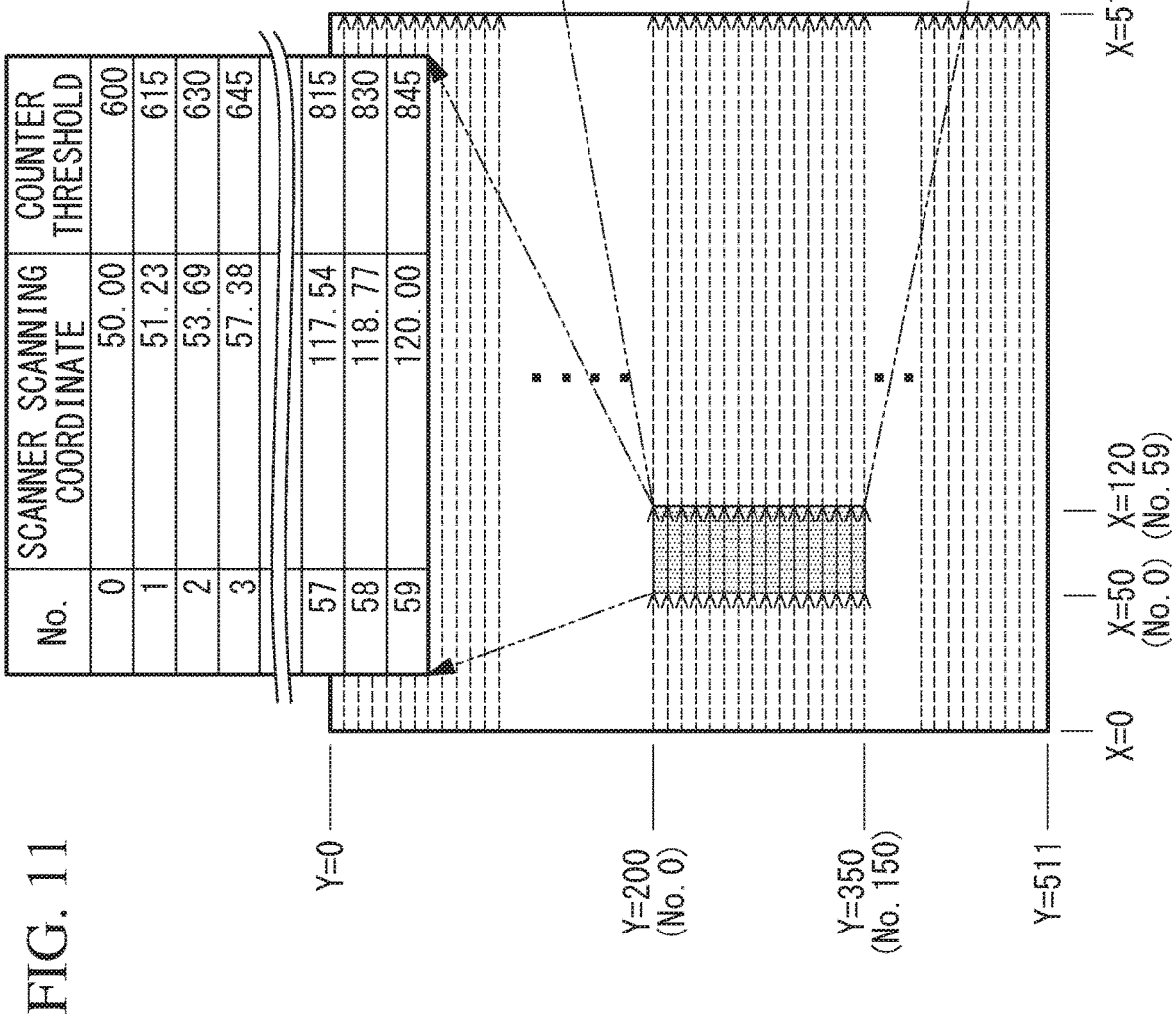
FIG. 11 is a diagram showing an example of scanner scanning coordinates corresponding to a scan target area and counter thresholds corresponding to a scan target area.

For example, as shown in FIG. 11, the calculation unit 8 of the control unit 7 may calculate a scan start coordinate and a scan end coordinate in a Y-direction in accordance with the number of pixels of the scan target area on the sample S specified by the user via the input device 37, and may store the calculated scan start coordinate and scan end coordinate in the Y direction in a memory (not shown).

Figure 12:
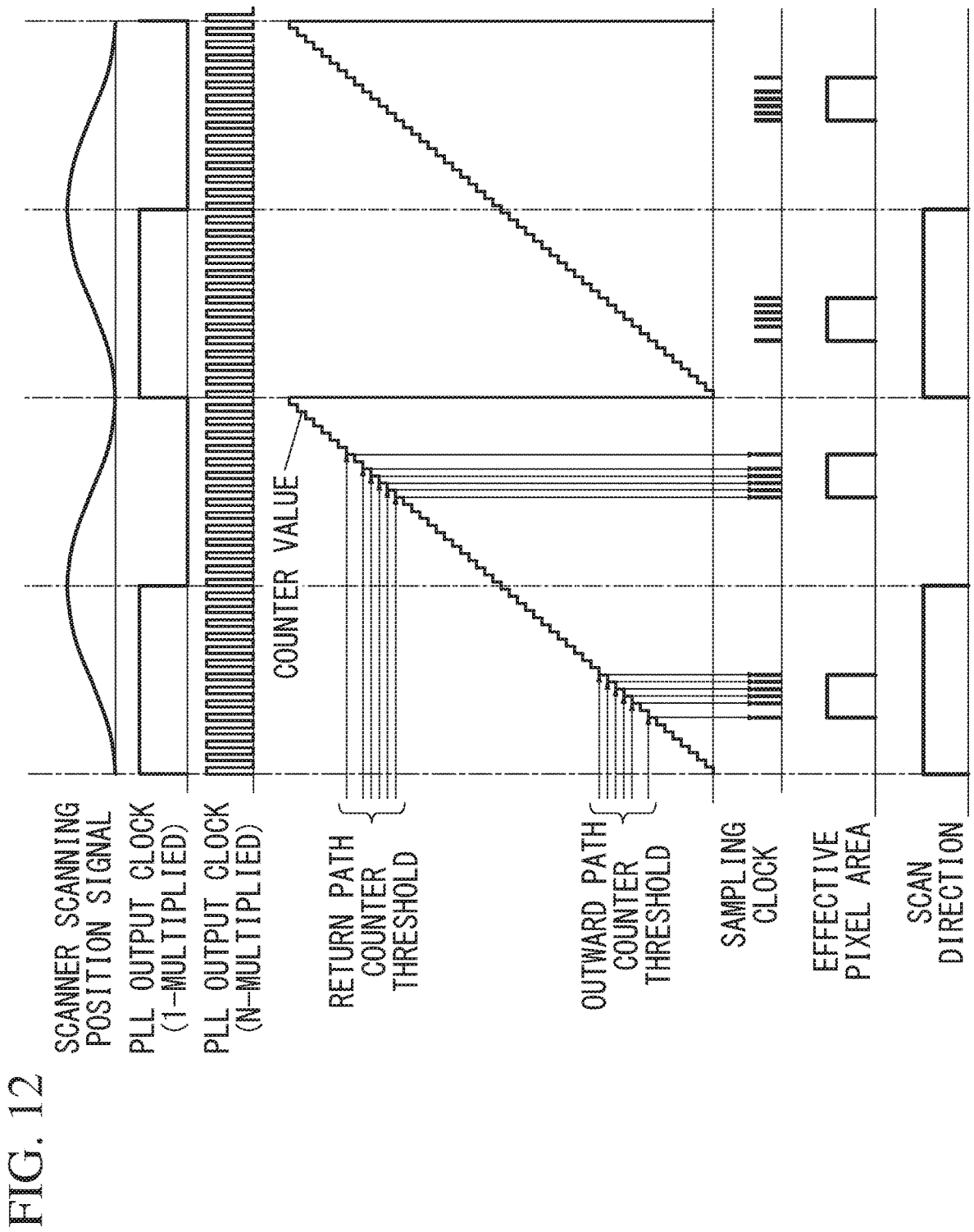
FIG. 12 is a timing chart showing an output timing of a sampling clock according to the third embodiment.

According to the laser scanning microscope 1 of the present embodiment, since the number of required counter thresholds differs according to the number of pixels in the scan target area to be actually scanned with a laser light, the counter thresholds are calculated based on the actual scanning range by the calculation unit 8 of the control unit 7, whereby for example, as shown in FIG. 12, the number of sampling clocks to be output can be changed to a number required for the actual scanning range. Further, clip scanning, high-resolution scanning, and the like can be supported by setting the counter thresholds.

Fourth Embodiment

Next, a sampling circuit and a laser scanning microscope according to a fourth embodiment of the present invention will be described.

Figure 13:
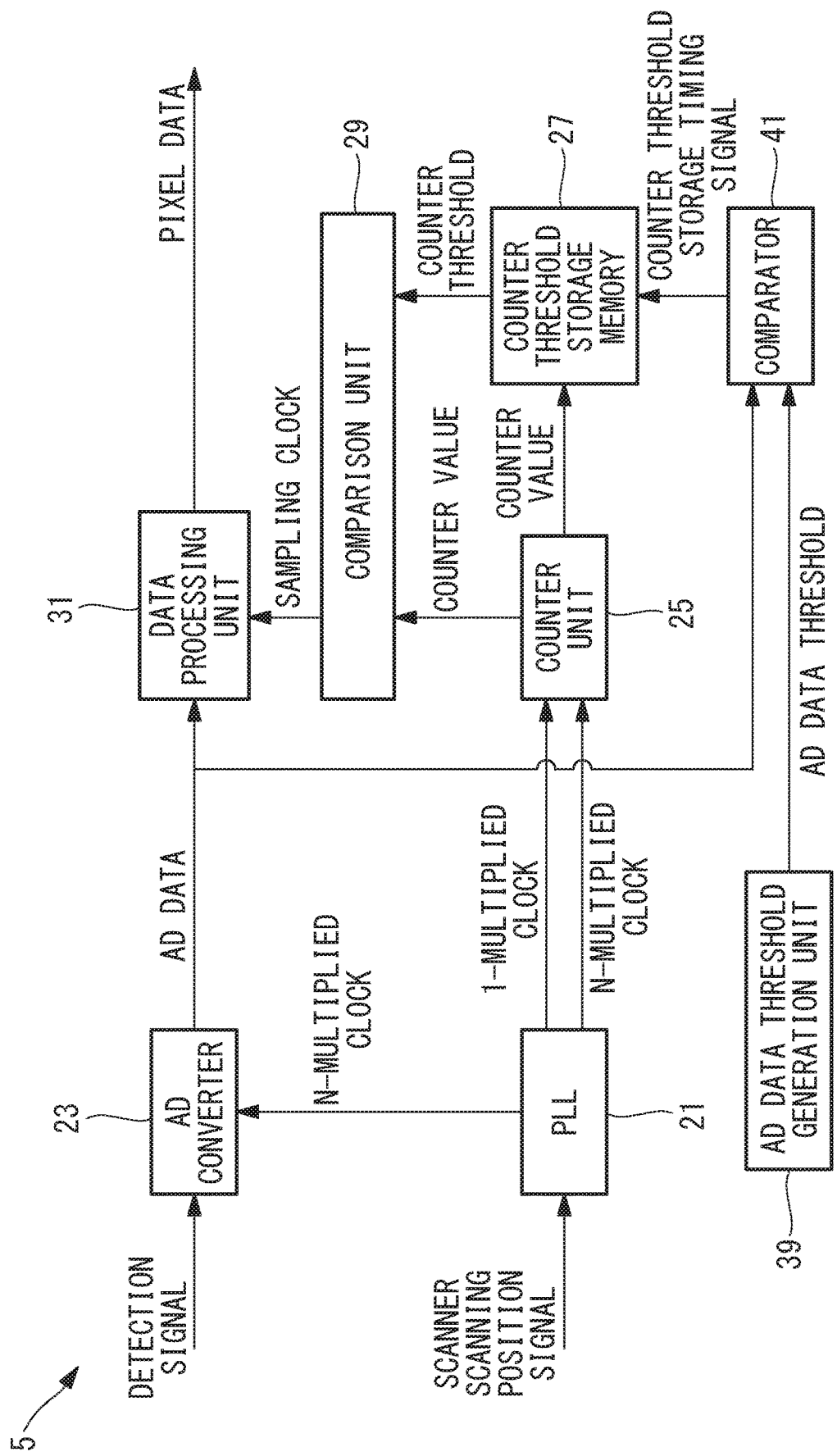
FIG. 13 is a block diagram showing a configuration of a sampling unit according to a fourth embodiment of the present invention.

For example, as shown in FIG. 13, the laser scanning microscope 1 according to the present is different from the first to third embodiments in that it includes an AD data threshold generation unit 39 for outputting a predetermined threshold of AD data, and a comparator 41 for comparing AD data output from the AD converter 23 with a threshold output from the AD data threshold generation unit 39.

Hereafter, portions which are common in configuration to those of the laser scanning microscopes 1 according to the first to third embodiments are represented by the same reference signs, and description thereof is omitted.

In the present embodiment, the A/D converter 23 transmits the A/D-converted A/D data to both the data processing unit 31 and the comparator 41. The counter unit 25 transmits the counter value being counted to both the counter threshold storage memory 27 and the comparison unit 29.

For example, a predetermined counter threshold is stored in the counter threshold storage memory 27.

Figure 14:
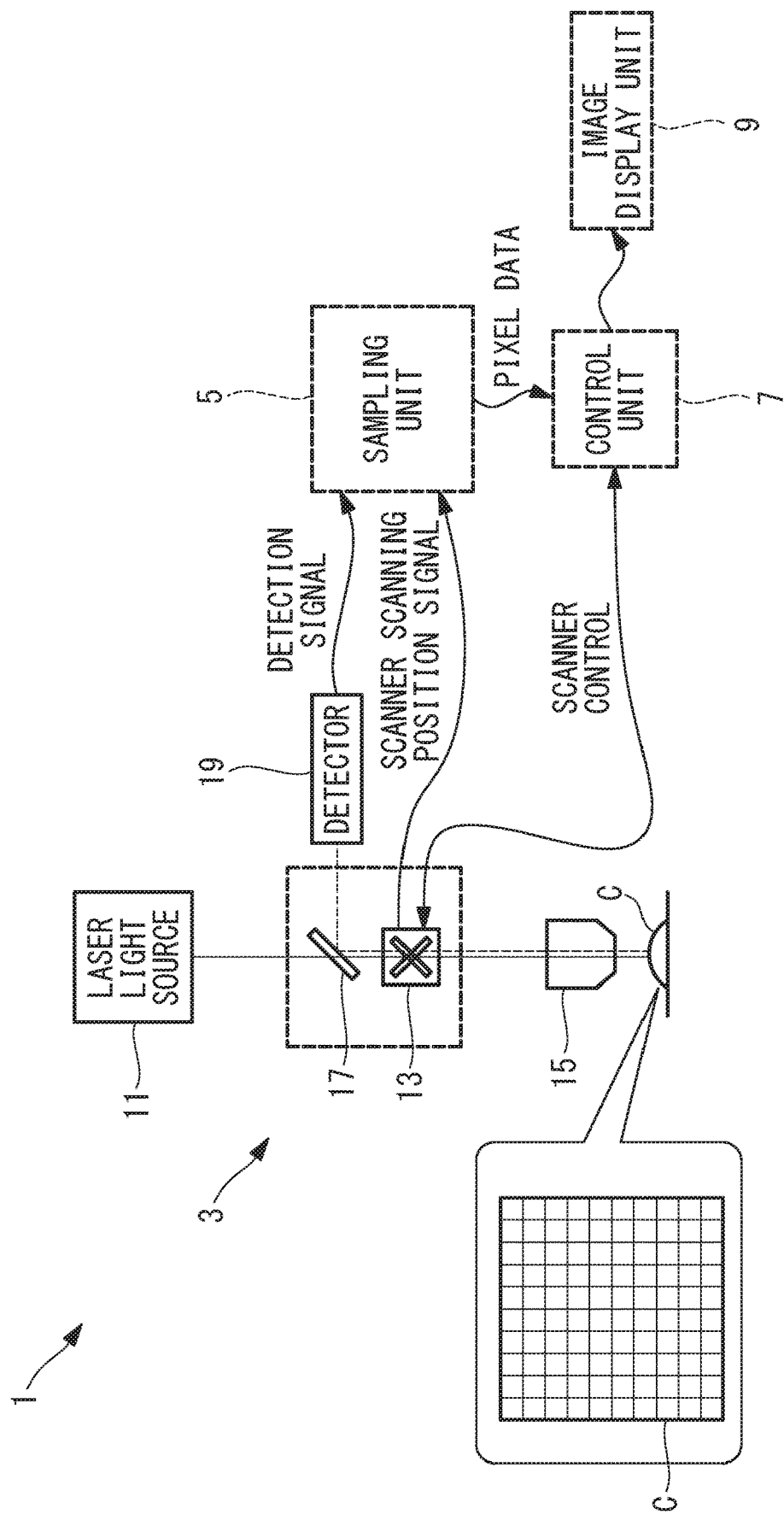
FIG. 14 is a schematic configuration diagram of a laser scanning microscope according to the fourth embodiment of the present invention.

In the present embodiment, when a counter threshold is created, for example, a grid chart C on which a known pattern is drawn is used instead of the sample S as shown in FIG. 14

One predetermined numerical value for discriminating light and darkness of the grid chart C is stored as an AD data threshold in the AD data threshold generation unit 39.

Specifically, a difference appears in AD data output from the AD converter 23 between when a black portion of the grid chart C, that is, a grid portion is scanned and when a white portion of the grid chart C, that is, a portion other than the grid is scanned. Therefore, a numerical value which enables discrimination between the AD data of the grid portion of the grid chart C and the AD data of the portion other than the grid is stored as the AD data threshold in the AD data threshold generation unit 39. The AD data threshold generation unit 39 transmits the stored AD data threshold to the comparator 41.

Figure 15:
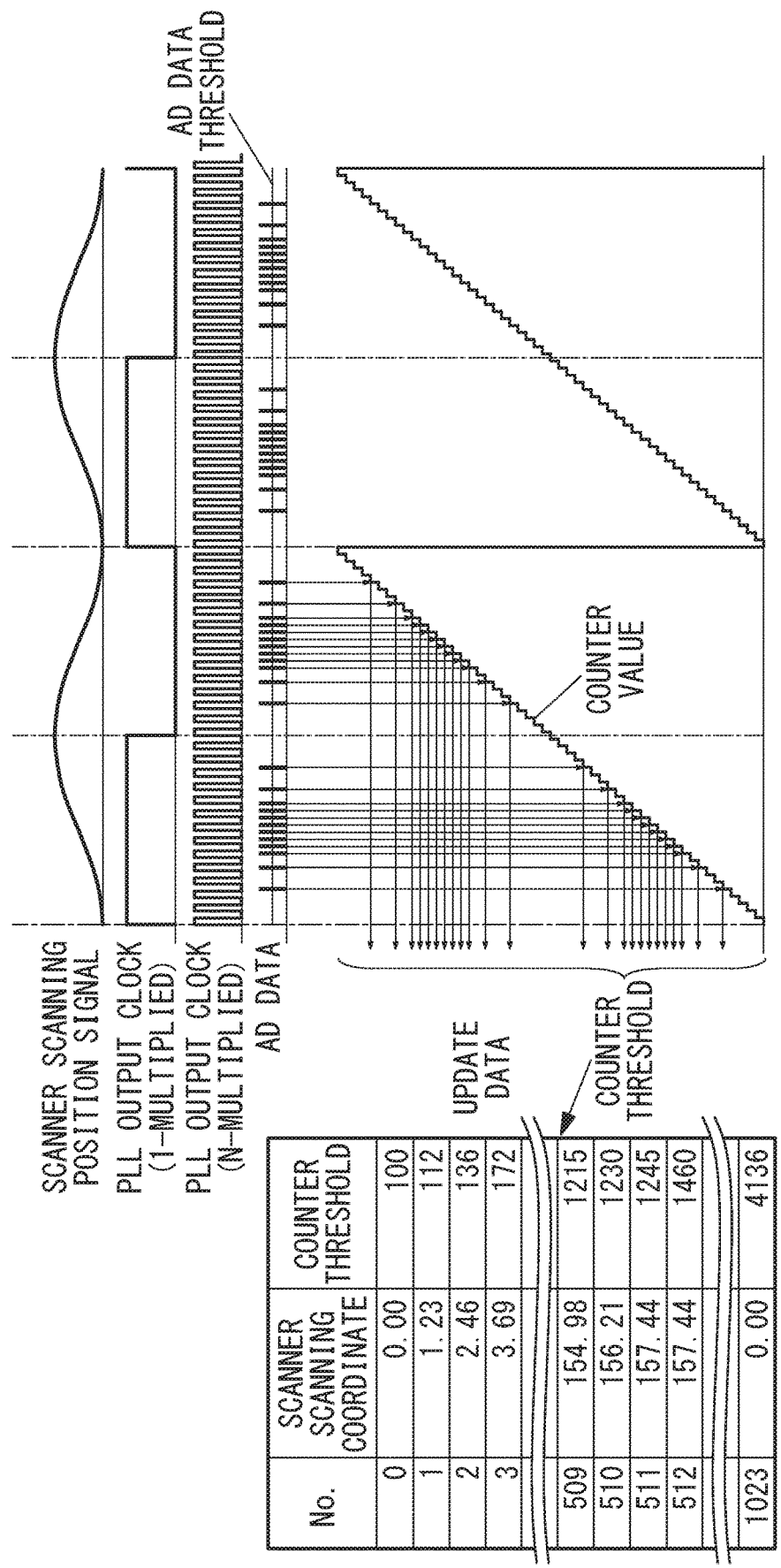
FIG. 15 is a timing chart showing an output timing of a sampling clock according to the fourth embodiment.

As shown in FIG. 15, the comparator 41 transmits, to the counter threshold storage memory 27, a counter threshold storage timing signal which rises when the magnitude of the AD data sent from the AD converter 23 exceeds the magnitude of the AD data threshold sent from the AD data threshold generation unit 39. Since the grid chart C has a known pattern, scanning coordinates when the magnitude of the AD data exceeds the magnitude of the AD data threshold, that is, when the counter threshold storage timing signal rises are predetermined.

The counter threshold storage memory 27 stores, as a counter threshold, a counter value counted by the counter unit 25 when the counter threshold storage timing signal sent from the comparator 41 rises while associating the counter value with a scanning coordinate when the counter threshold storage timing signal rises.

A method of creating the counter threshold by the laser scanning microscope 1 according to the present embodiment will be described.

In order to create the counter threshold by the laser scanning microscope 1 having the above-described configuration, first, instead of the sample S, the grid chart C on which a known pattern is drawn is scanned with a laser light. A detection signal detected by the detector 19 when scanning is performed on the grid chart C is converted into AD data by the AD converter 23, and the converted AD data is sent to the comparator 41.

Next, the comparator 41 compares the AD data sent from the AD converter 23 with the AD data threshold sent from the AD data threshold generation unit 39. Then, a counter threshold storage timing signal that rises when the magnitude of the AD data exceeds the magnitude of the AD data threshold is sent from the comparator 41 to the counter threshold storage memory 27. The magnitude of the AD data exceeds the magnitude of the AD data threshold when the grid portion of the sample S is scanned, and the coordinates of the grid portion are determined by the pattern of the grid chart C.

Next, in the counter threshold storage memory 27, as shown in FIG. 15, when the counter threshold storage timing signal rises, that is, the magnitude of the AD data exceeds the magnitude of the AD data threshold, a counter value counted by the counter unit 25 is written as a counter threshold in association with the scanning coordinate, thereby updating the counter threshold.

When all the counter thresholds in the counter threshold storage memory 27 have been updated, the comparison unit 29 generates a sampling clock based on the updated counter thresholds.

According to the present embodiment, by using, as a counter threshold, a counter value corresponding to an arbitrary scanning coordinate by the resonant scanner 13, it is possible to generate a sampling clock for which the individual difference of the resonant scanner 13 and the scan positional shift between the outward path and the return path by the resonant scanner 13 are corrected.

In the present embodiment, the predetermined AD data thresholds have been stored in the AD data threshold generation unit 39. Instead, for example, an intermediate value between the minimum value and the maximum value of the AD data may be calculated by the calculation unit of the control unit 7, and the calculated value may be automatically stored in the AD data threshold generation unit 39.

The present embodiment may be modified to the following configuration.

Figure 16:
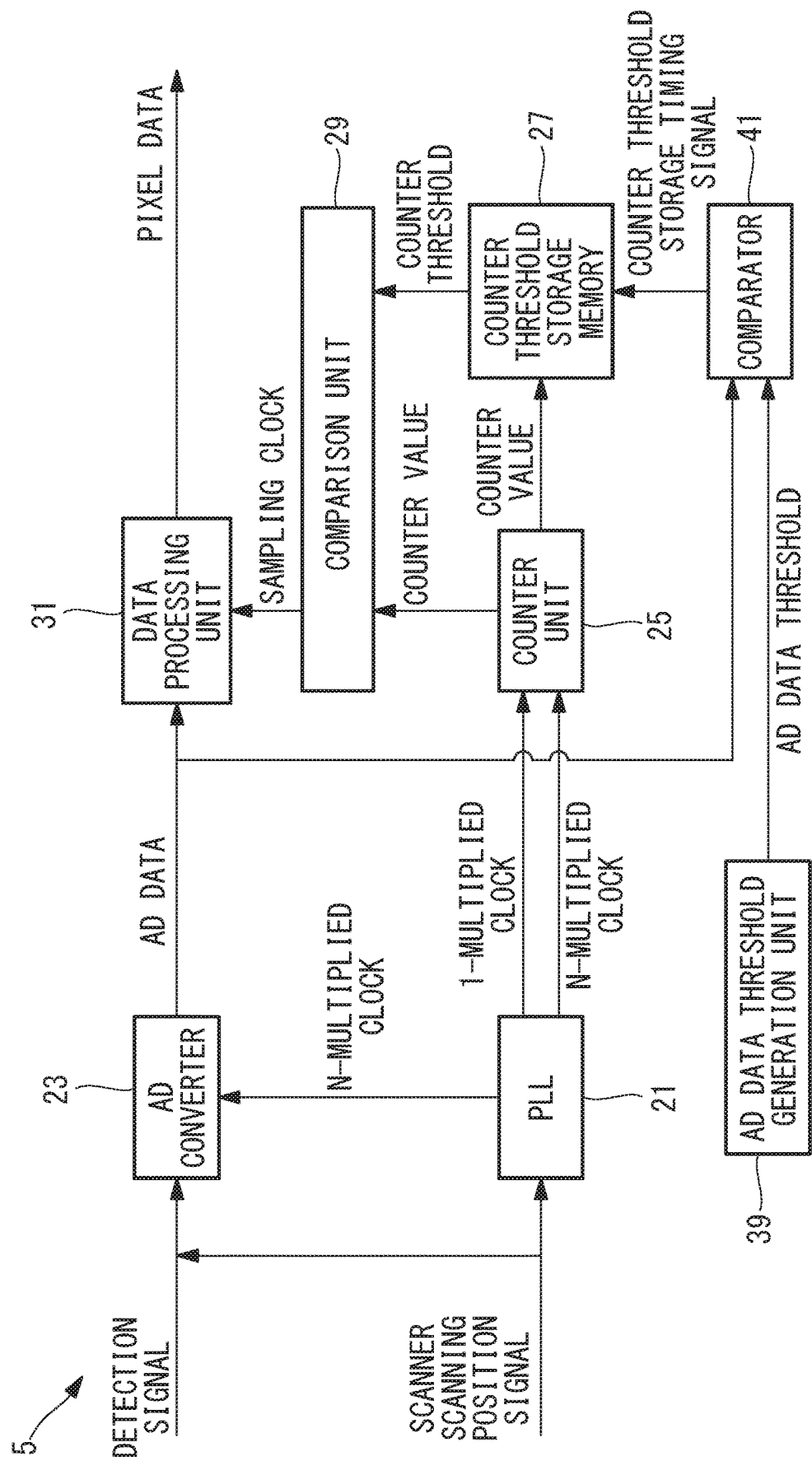
FIG. 16 is a block diagram showing a configuration of a sampling unit according to a modification of the fourth embodiment of the present invention.

For example, as shown in FIG. 16, when a counter threshold is created, instead of using the grid chart C, AD data obtained by converting a scanner scanning position signal into AD data by the AD converter 23 may be used.

In this case, for example, an AD data threshold corresponding to each scanning coordinate by the resonant scanner 13 as shown in FIG. 17 is stored in the counter threshold storage memory 27.

Figure 18:
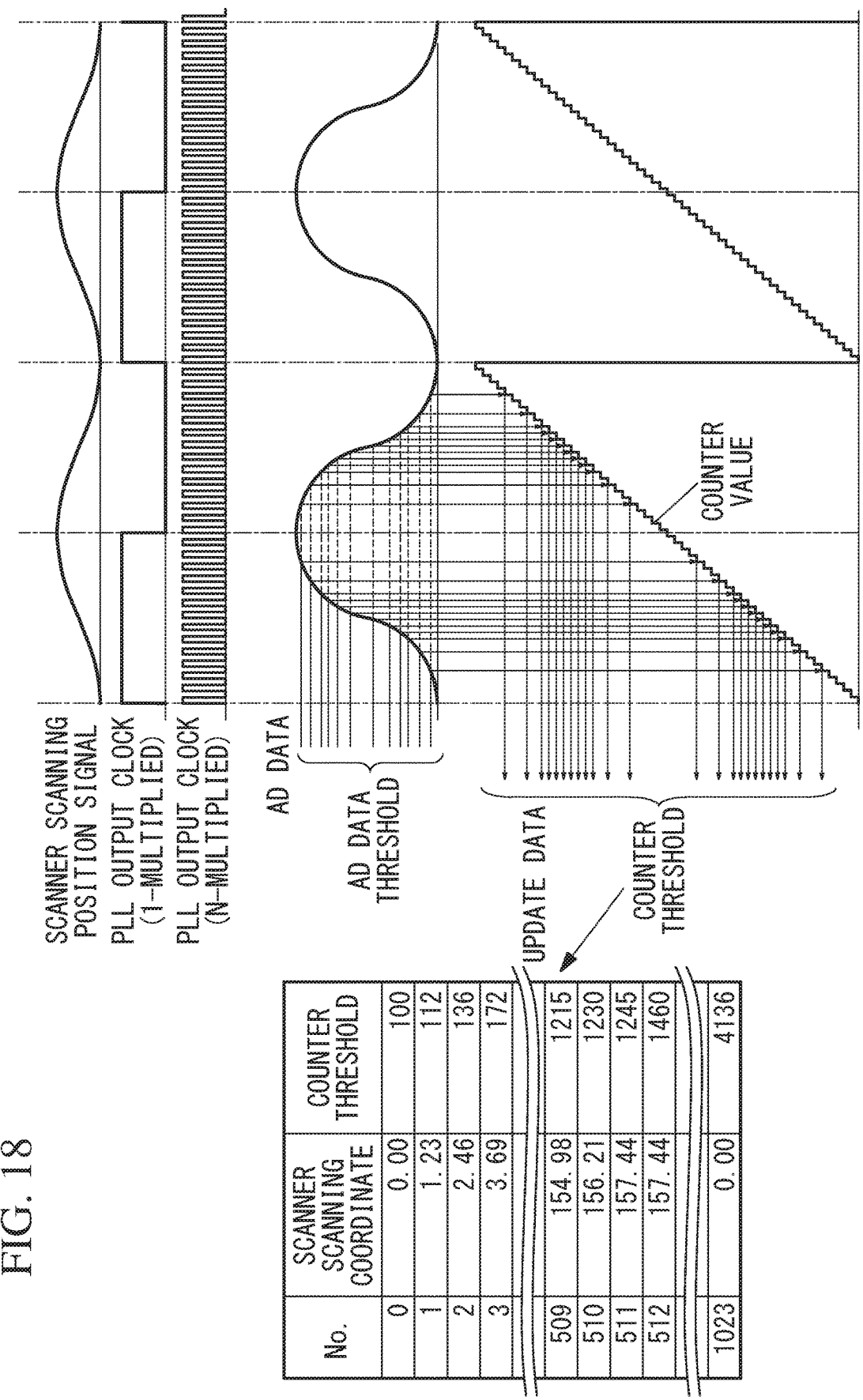
FIG. 18 is a timing chart showing an output timing of a sampling clock according to a modification of the fourth embodiment.

For example, as shown in FIG. 18, the comparator 41 transmits, to the counter threshold storage memory 27, a counter threshold storage timing signal indicating a timing at which the AD data converted from the scanner scanning position signal by the AD converter 23 coincides with an AD data threshold stored in the AD data threshold generation unit 39 while associating the counter threshold storage timing signal with the scanning coordinate of the AD data threshold.

The counter threshold storage memory 27 stores, as the counter threshold, the counter value counted by the counter unit 25 at the timing indicated by the counter threshold storage timing signal sent from the comparator 41 while associating the counter value with the scanning coordinate. As a result, the counter threshold is updated.

When the counter threshold of the counter threshold storage memory 27 is updated, the signal input to the AD converter 23 is returned to the detection signal of the detector 19. As a result, the comparison unit 29 uses the updated counter threshold to output the sampling clock According to the present modification, a sampling clock for which the individual difference of the resonant scanner 13 and the reciprocating shift are corrected can be generated without any grid chart C or the like.

Each of the above-described embodiments can be modified to the following configuration.

In each of the above-described embodiments, the data processing unit 31 samples only the AD data that has been AD-converted in synchronization with the rising of the sampling clock. Instead of the above configuration, the data processing unit 31 may sample a plurality of AD data based on a sampling clock output from the comparison unit 29, for example.

Figure 19:
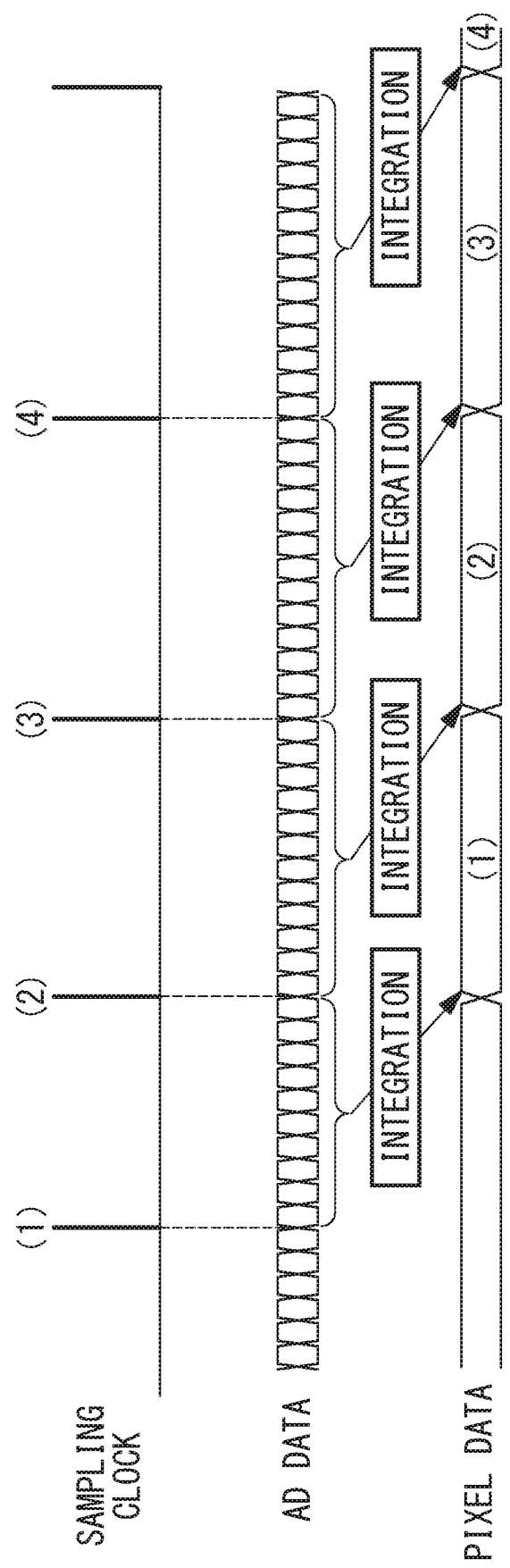
FIG. 19 is a timing chart showing the relationship of the sampling clock, the output timing of AD data, and pixel data in first modifications of the first to fourth embodiments.

In this case, as a first modification, for example, as shown in FIG. 19, the data processing unit 31 may integrate all AD data which have been sent from the AD converter 23 from the rising of a sampling clock output from the comparison unit 29 until the rising of a next sampling clock. Pixel data may be generated based on the integrated AD data (integration signal).

FIG. 19 shows an example in which image data are generated by integrating 10 pieces of AD data during a period of time from the rising of a sampling clock of (1) until the rising of a sampling clock of (2), 12 pieces of AD data during a period of time from the rising of the sampling clock of (2) until the rising of a sampling clock of (3), and 13 pieces of AD data during a period of time from the rising of the sampling clock of (3) until the rising of a sampling clock of (4), respectively.

In the present modification, the data processing unit 31 may divide the generated pixel data by the number of integrated AD data.

By averaging the pixel data, a detection time of fluorescence emitted from the sample S can be lengthened while suppressing variation in brightness caused by the difference in the detection time.

As a second modification, the data processing unit 31 may integrate a certain number of pieces of AD data that have been AD-converted temporally before or after the output of the sampling clock from the comparison unit 29.

Figure 20:
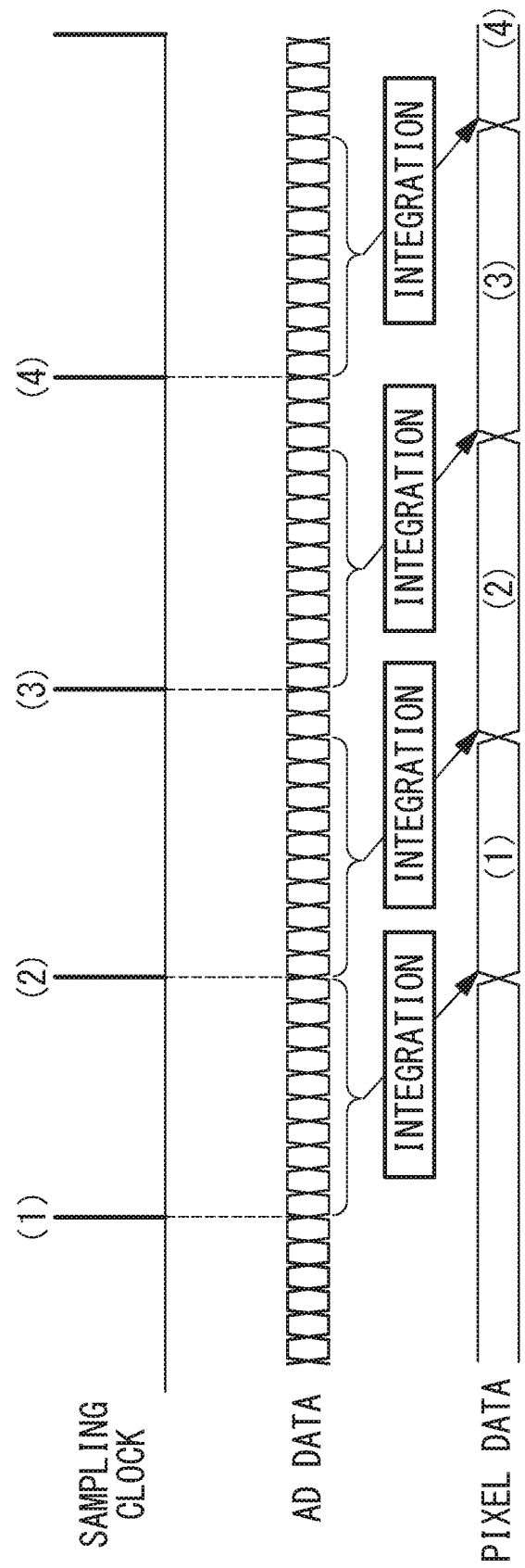
FIG. 20 is a timing chart showing the relationship of the sampling clock, the output timing of AD data, and pixel data according to second modifications of the first to fourth embodiments.

For example, as shown in FIG. 20, the data processing unit 31 may integrate a certain number of pieces of AD data which have been sent from the AD converter 23 from the rising of a sampling clock until the rising of a next sampling clock, and pixel data may be generated based on the integrated AD data.

FIG. 20 shows an example in which sampling is started in synchronization with the rising of each of the sampling clock of (1), the sampling clock of (2), the sampling clock of (3), and the sampling clock of (4), and 10 pieces of AD data are integrated during each of all the periods of time to generate each image data.

In this case, since the number of AD data to be integrated is constant in all pixel data, it is possible to eliminate variation in brightness caused by the difference in integration time. The certain number of AD data to be integrated may be adjusted to the number of pieces of AD data output from the AD converter 23 during a period of time in which an output interval of the sampling clocks is shortest.

Figure 21:
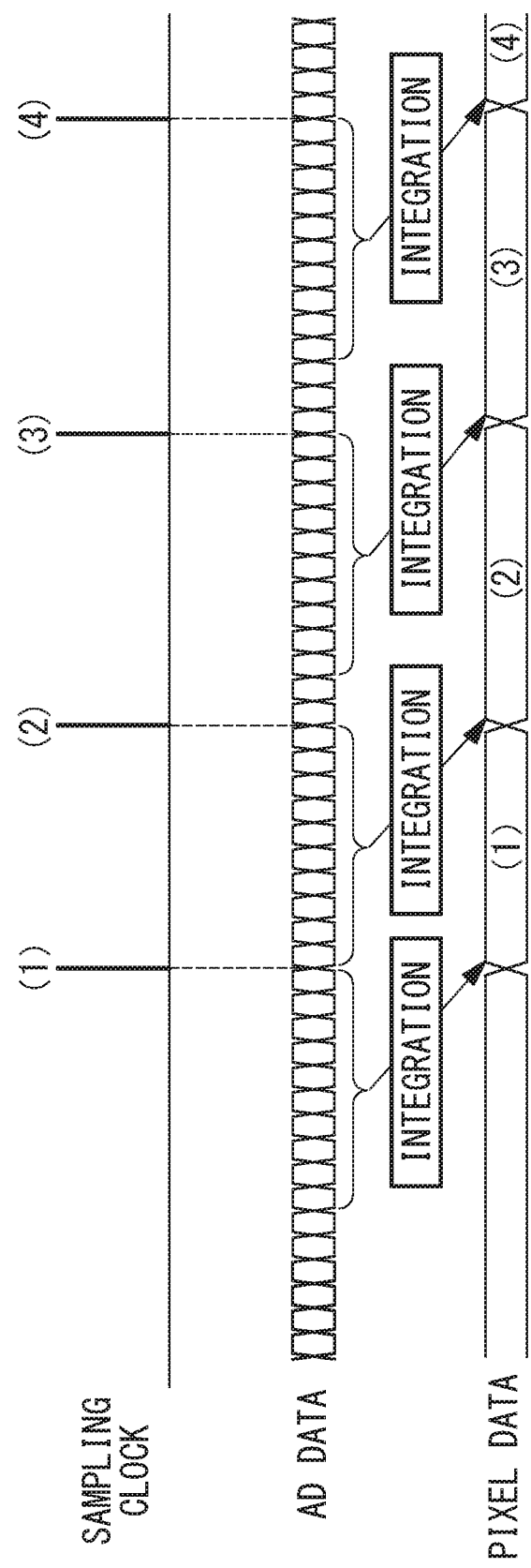
FIG. 21 is a timing chart showing the relationship of the sampling clock, the output timing of AD data, and pixel data according to other second modifications of the first to fourth embodiments.

For example, as shown in FIG. 21, the data processing unit 31 may integrate a certain number of pieces of AD data which have been sent temporally retroactively based on the output of the sampling clock out of a plurality of pieces of AD data sent from the AD converter 23, and generate pixel data based on the integrated AD data.

FIG. 21 shows an example in which 10 pieces of AD data immediately before the rising of each of the sampling clock of (1), the sampling clock of (2), the sampling clock of (3), and the sampling clock of (4) are integrated to generate each of image data.

Figure 22:
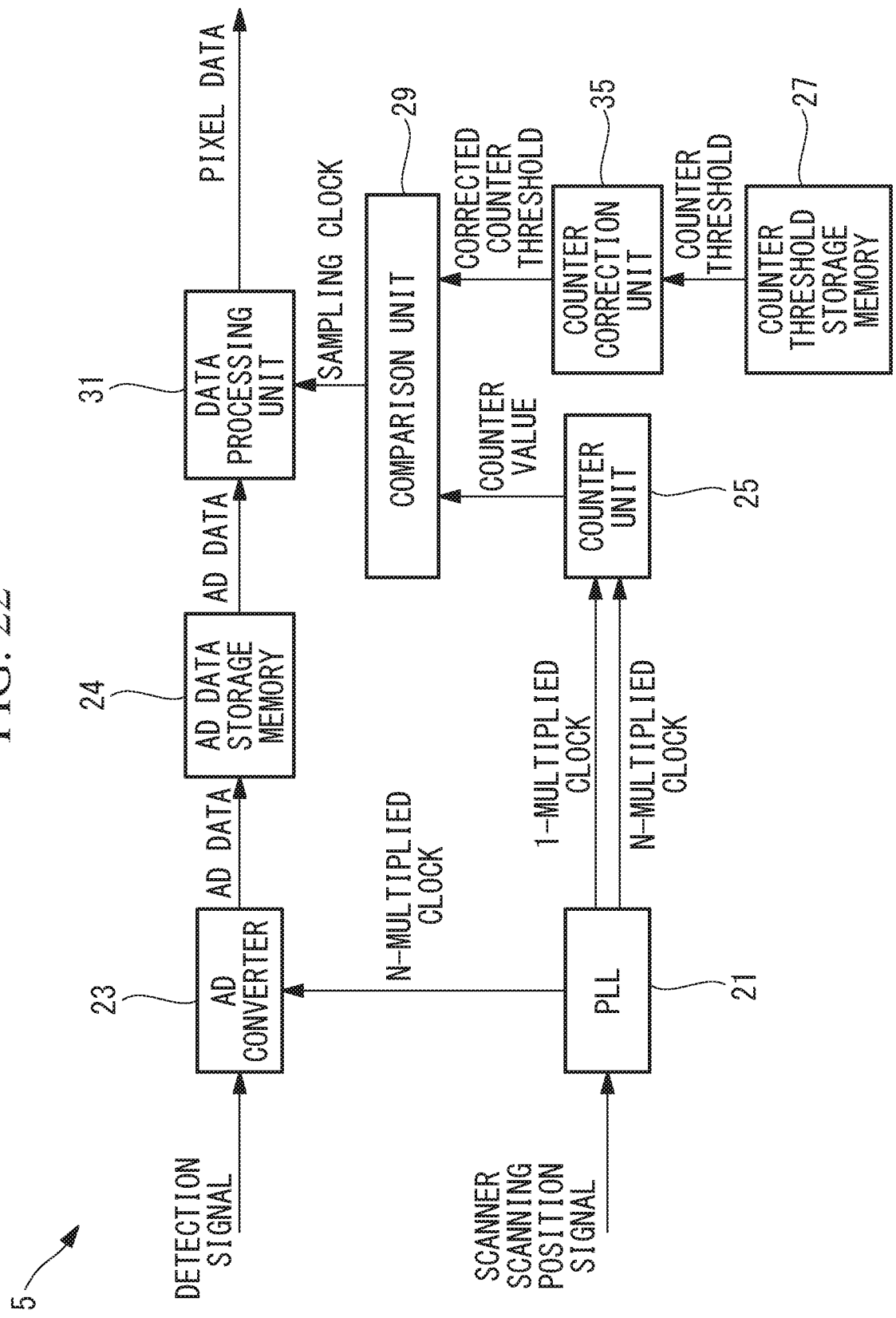
FIG. 22 is a block diagram showing a configuration of a sampling unit according to the example of FIG. 21.

In this case, in order to retroactively integrate past AD data pieces, for example, as shown in FIG. 22, an AD data storage memory 24 may be provided which temporarily stores AD data output from the AD converter 23 before the AD data is transmitted to the data processing unit 31.

As a third modification, the data processing unit 31 may integrate a certain number of pieces of AD data that have been A/D-converted during a period of time which spans temporally before and after the output of the sampling clock from the comparison unit 29.

Figure 23:
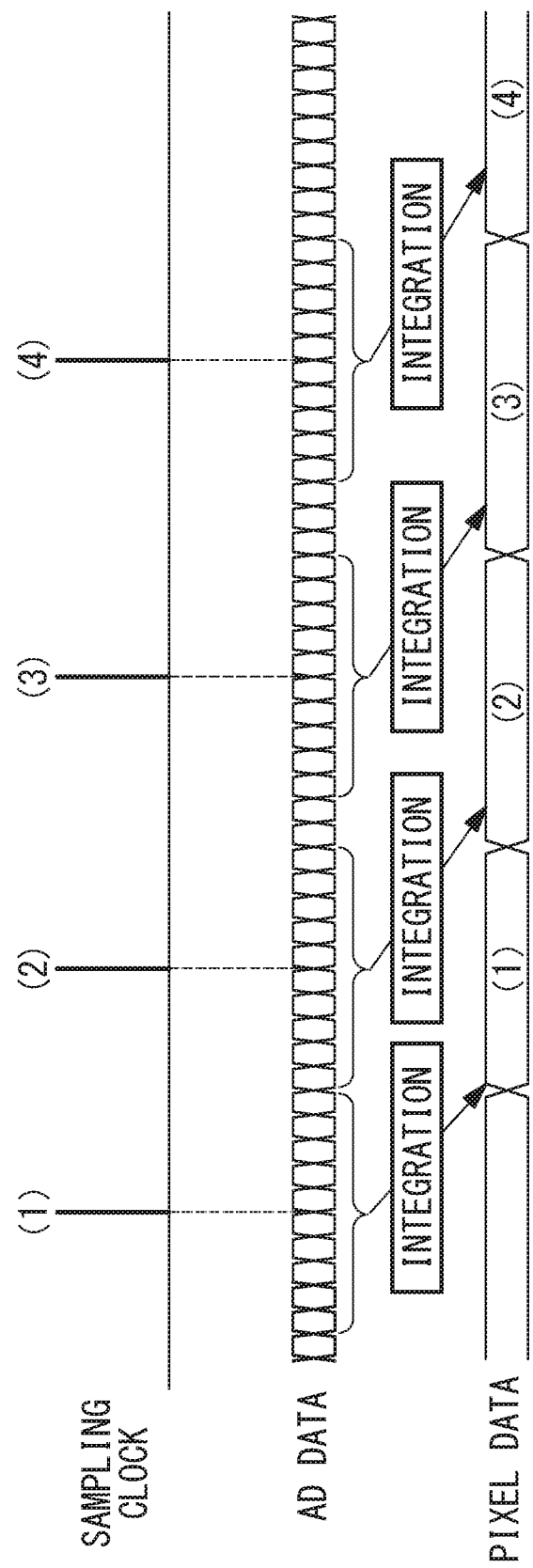
FIG. 23 is a timing chart showing the relationship of the sampling clock, the output timing of AD data, and pixel data according to third modifications of the first to fourth embodiments.

For example, as shown in FIG. 23, the data processing unit 31 may integrate a certain number of pieces of AD data which have been sent from the AD converter 23 before and after the rising of the sampling clock, and generate pixel data based on the integrated AD data. In this case, in order to integrate past AD data retroactively, an AD data storage memory 24 may also be provided as shown in FIG. 22.

FIG. 23 shows an example in which totally 10 pieces of AD data of five pieces of AD data immediately before and five pieces of AD data immediately after the rising of each of the sampling clock of (1), the sampling clock of (2), the sampling clock of (3), and the sampling clock of (4) to generate each of image data.

As described above, the embodiments of the present invention have been described in detail with reference to the drawings. However, the specific configuration thereof is not limited to the embodiments, and includes a design change, etc. without departing from the scope of the present invention. For example, the present invention is not limited to those applied to the above embodiments and modifications, but may be applied to embodiments in which these embodiments and modifications are appropriately combined, and is not particularly limited.

As a result, the following aspects are derived from the above embodiments.

An aspect of the present invention is a sampling circuit including: a phase synchronization unit that generates, based on a scanning position signal indicating a scanning position of a laser light scanned on a sample by a scanner and by a phase-locked loop, an N-multiplied clock which has a frequency N times as high as a scan frequency of the scanning position signal (N represents an integer of 1 or more) and is synchronized with a phase of the scanning position signal; an AD conversion unit that AD-converts a detection signal obtained by converting light from the sample by a detector in synchronization with the N-multiplied clock generated by the phase synchronization unit; a counter unit that counts the number of clocks in synchronization with the N-multiplied clock; a threshold storage unit that stores at least one predetermined counter threshold of the counter unit corresponding to a desired scanning position by the scanner; a comparison unit that compares the counter threshold stored by the threshold storage unit with a counter value indicating the number of clocks counted by the counter unit and outputs a sampling clock when the counter threshold and the counter value coincide with each other; and a data processing unit that samples the detection signal AD-converted by the AD conversion unit based on the sampling clock output from the comparison unit and generates pixel data based on the sampled detection signal.

According to this aspect, the detection signal of the light from the sample is AD-converted by the AD conversion unit in synchronization with the N-multiplied clock synchronized with the phase of the scanning position signal of the scanner generated by the phase synchronization unit, and the counting of the number of clocks is performed by the counter unit. In the data processing unit, the AD-converted detection signal is sampled based on the sampling clock output from the comparison unit when the counter value of the counter unit coincides with a predetermined counter threshold corresponding to a desired scanning position of the scanner stored in the threshold storage unit. As a result, pixel data can be generated based on the AD-converted detection signal obtained at a timing when the desired scanning position is scanned by the scanner.

In this case, the AD conversion by the AD conversion unit and the counting by the counter unit are synchronized with the N-multiplied clock which is synchronized with the scanning position signal of the scanner. As a result, even if the oscillation cycle of the scanner fluctuates due to the influence of temperature change or the like, or the characteristics vary among scanners, the AD conversion unit and the counter are enabled to operate accurately in synchronization with the scanning of the scanner. Therefore, irrespective of the influence of temperature change and the influence of variation in the characteristics among scanners, sampling can be performed in synchronization with the scanning of the scanner without requiring any complicated work.

The above-described aspect may be provided with a correction amount generation unit that outputs a correction amount for correcting a shift between the scanning start positions of the laser light on the outward path and the return path by the scanner, and a counter threshold correction unit that corrects the counter threshold stored by the threshold storage unit based on the correction amount output from the correction amount generation unit.

This configuration makes it possible to correct the pixel shift between the scanning of the laser light on the outward path and the scanning of the laser light on the return path by the scanner.

In the above-described aspect, the data processing unit may sample only the detection signal that has been AD-converted in synchronization with the output of the sampling clock.

In the above-described aspect, the data processing unit may sample a plurality of detection signals based on the output of the sampling clock, and generate the pixel data based on an integration signal obtained by integrating the plurality of sampled detection signals.

In the above-described aspect, the plurality of detection signals may be all the detection signals that have been AD-converted during a period of time from the output of a sampling clock until the output of a next sampling clock.

In the above-described aspect, the plurality of detection signals may be a certain number of the detection signals that have been AD-converted temporally before or after the output of the sampling clock output.

In the above-described aspect, the plurality of detection signals may be a certain number of the detection signals that have been AD-converted in a period of time that spans temporally before and after the output of the sampling clock.

Another aspect of the present invention is a laser scanning microscope including: a laser light source that generates the laser light, a microscope main body having the scanner and the detector, any one of the sampling circuits described above, and a control unit that controls the sampling circuit and the scanner, and an image data generation unit that generates image data of the sample based on the pixel data obtained by the sampling circuit.

According to this aspect, an image of a sample can be generated accurately by the image data generation unit based on pixel data generated by a sampling circuit that can perform sampling synchronized with scanning of a scanner without requiring any complicated work regardless of the influence of temperature change and the influence of variation in the characteristics among scanners.

The laser scanning microscope according to the above-described aspect may include an input unit that specifies a scanning range on the sample to be scanned with the laser light by the scanner, and a threshold calculation unit that calculates the counter threshold based on the scanning range specified by the input unit.

The required number of counter thresholds changes depending on the size of the scanning range to be actually scanned with a laser light. Therefore, the counter threshold is calculated based on the actual scanning range by the threshold calculation unit, whereby the number of sampling clocks can also be changed to the number required for the actual scanning range.

The present invention achieves an effect of making it possible to easily perform sampling synchronized with scanning of a scanner without requiring any complicated work irrespective of the influence of temperature change and the influence of variation in characteristics among scanners.

REFERENCE SIGNS LIST 1 laser scanning microscope
3 microscope main body
5 sampling unit (sampling circuit)
7 control unit
8 calculation unit (threshold calculation unit)
11 laser light source
13 resonant scanner (scanner)
19 detector
21 PLL unit (phase synchronization unit)
23 AD converter (AD conversion unit)
25 counter unit
27 counter threshold storage memory (threshold storage unit)
29 comparison unit
31 data processing unit (image data generation unit)
33 reciprocating scan correction amount generation unit (correction amount generation unit)
35 counter correction unit (counter threshold correction unit)
37 input device (input unit)
S sample

The invention claimed is:

1. A sampling circuit comprising:
a phase synchronization circuit that generates, based on a scanning position signal indicating a scanning position of a laser light scanned on a sample by a scanner and by a phase-locked loop, an N-multiplied clock which has a frequency N times as high as a scan frequency of the scanning position signal (N represents an integer of 1 or more) and is synchronized with a phase of the scanning position signal;
an AD converter that AD-converts a detection signal obtained by converting light from the sample with a detector in synchronization with the N-multiplied clock generated by the phase synchronization circuit;
a counter that counts a number of clocks in synchronization with the N-multiplied clock;
a memory that stores at least one predetermined counter threshold of the counter corresponding to a desired scanning position by the scanner;
a comparison circuit that compares the counter threshold stored in the memory with a counter value indicating the number of clocks counted by the counter and outputs a sampling clock in response to the counter threshold and the counter value coinciding with each other; and
a data processing circuit that samples the detection signal AD-converted by the AD converter based on the sampling clock output from the comparison circuit and generates pixel data based on the sampled detection signal.

2. The sampling circuit according to claim 1, further comprising:
a correction amount generation circuit that outputs a correction amount for correcting a shift between scanning start positions of the laser light on an outward path and a return path by the scanner; and
a counter threshold correction circuit that corrects the counter threshold stored in the memory based on the correction amount output from the correction amount generation circuit.

3. The sampling circuit according to claim 1, wherein the data processing circuit samples only the detection signal that has been AD-converted in synchronization with an output of the sampling clock.

4. The sampling circuit according to claim 1,
wherein the detection signal includes a plurality of detection signals, and
wherein the data processing circuit samples the plurality of detection signals based on an output of the sampling clock, and generates the pixel data based on an integration signal obtained by integrating the plurality of sampled detection signals.

5. The sampling circuit according to claim 4, wherein the plurality of detection signals include all detection signals that have been AD-converted during a period of time from an output of a sampling clock until an output of a next sampling clock.

6. The sampling circuit according to claim 4, wherein the plurality of detection signals include a certain number of detection signals that have been AD-converted temporally before or after an output of the sampling clock.

7. The sampling circuit according to claim 4, wherein the plurality of detection signals are a certain number of detection signals that have been AD-converted in a period of time that spans temporally before and after an output of the sampling clock.

8. A laser scanning microscope comprising:
the sampling circuit according to claim 1;
a laser light source that generates the laser light;
a microscope main body including the scanner and the detector; and
a controller that controls the sampling circuit and the scanner,
wherein the controller is configured to generate image data of the sample based on the pixel data obtained by the sampling circuit.

9. The laser scanning microscope according to claim 8 further comprising an input device that specifies a scanning range on the sample to be scanned with the laser light by the scanner,
wherein the controller is configured to calculate the counter threshold based on the scanning range specified by the input device.

* * * * *